US012580152B2

(12) United States Patent
Mebarki et al.

(10) Patent No.: US 12,580,152 B2
(45) Date of Patent: Mar. 17, 2026

(54) APPARATUS AND METHOD OF DAMAGE MITIGATION AND STEP COVERAGE ENHANCEMENT

(71) Applicant: Applied Materials, Inc., Santa Clara, CA (US)

(72) Inventors: Bencherki Mebarki, Santa Clara, CA (US); Sang-Heum Kim, Mountain View, CA (US); Joung Joo Lee, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 18/926,504

(22) Filed: Oct. 25, 2024

(65) Prior Publication Data

US 2025/0157790 A1     May 15, 2025

Related U.S. Application Data

(60) Provisional application No. 63/597,966, filed on Nov. 10, 2023.

(51) Int. Cl.
| | |
|---|---|
| *C23C 14/34* | (2006.01) |
| *C23C 14/35* | (2006.01) |
| *H01J 37/32* | (2006.01) |

(52) U.S. Cl.
CPC .......... *H01J 37/321* (2013.01); *C23C 14/345* (2013.01); *C23C 14/3492* (2013.01);
(Continued)

(58) Field of Classification Search
None
See application file for complete search history.

(56) References Cited

U.S. PATENT DOCUMENTS

| | | | | |
|---|---|---|---|---|
| 5,707,498 A | * | 1/1998 | Ngan | .................... H01J 37/321 |
| | | | | 204/192.12 |
| 5,830,330 A | * | 11/1998 | Lantsman | ........... H01J 37/3405 |
| | | | | 204/192.12 |

(Continued)

FOREIGN PATENT DOCUMENTS

| | | |
|---|---|---|
| EP | 0799903 A2 | 10/1997 |
| KR | 20110007192 A | 1/2011 |

OTHER PUBLICATIONS

International Search Report and Written Opinion dated Feb. 21, 2025 for Application No. PCT/US2024/053853.

*Primary Examiner* — Jason Berman
(74) *Attorney, Agent, or Firm* — Patterson + Sheridan, LLP

(57) ABSTRACT

Embodiments described herein provide an apparatus and method for fabricating semiconductor devices with improved process control and performance. The apparatus includes a processing chamber with first and second RF coil assemblies generating primary and secondary plasmas in distinct regions, along with first and second electromagnet assemblies for independent magnetic field control. A removable biasable flux optimizer is disposed in the apparatus to modulate plasma distribution and directionality. The method involves a three-step sequence comprising Inductive coupled plasma (IMP) low energy deposition, deposition for enhanced step coverage, and etching for overhang removal. The ICP deposition utilizes primary and secondary plasmas generated by the RF coil assemblies, with intensified collisions achieved through chamber pressure increase. Additionally, a simultaneous deposition and etching process can be employed, with optional additional etching steps for improved overhang removal.

14 Claims, 11 Drawing Sheets

(52) U.S. Cl.
CPC ........ *C23C 14/358* (2013.01); *H01J 37/3266*
(2013.01); *H01J 37/32816* (2013.01); *H01J*
*2237/332* (2013.01)

(56) References Cited

U.S. PATENT DOCUMENTS

| | | | | |
|---|---|---|---|---|
| 6,193,855 | B1 * | 2/2001 | Gopalraja | ............. C23C 14/345 |
| | | | | 204/192.12 |
| 6,449,525 | B1 | 9/2002 | Liu et al. | |
| 6,458,251 | B1 * | 10/2002 | Sundarrajan | .......... C23C 14/046 |
| | | | | 204/192.15 |
| 2005/0056536 | A1 | 3/2005 | Gopalraja et al. | |
| 2005/0263390 | A1 | 12/2005 | Gung et al. | |
| 2008/0190760 | A1 * | 8/2008 | Tang | ................... H01J 37/3408 |
| | | | | 204/192.17 |

* cited by examiner

400

410

420

APPARATUS AND METHOD OF DAMAGE MITIGATION AND STEP COVERAGE ENHANCEMENT

CROSS-REFERENCE TO RELATED APPLICATIONS

This application claims the benefit of U.S. Provisional Application 63/597,966 filed on Nov. 10, 2023, which is herein incorporated by reference.

BACKGROUND

Field

Embodiments of the present disclosure generally relate to physical vapor deposition (PVD) film formation on substrates in a device fabrication process, and more particularly, to apparatus and methods for depositing one or more film layers in features formed on a substrate.

Description of the Related Art

The field of semiconductor device fabrication is constantly evolving, with new materials, processes, and equipment being developed to meet the growing demand for smaller, faster, and more complex devices. One of the key challenges in device fabrication is the need to deposit thin films of various materials with high quality, uniformity, and precision.

Physical vapor deposition (PVD) is a common technique used for depositing thin films of various metals and metal alloys. However, PVD deposition can cause damage to the underlying layers of the substrate, particularly when high-energy ions are used to enhance the deposition rate or when the substrate features are small and have high aspect ratios. This damage can lead to poor step coverage and other defects, which can compromise the performance and reliability of the device.

Therefore, there is a need for an improved deposition apparatus that can provide high-quality, and uniform thin films without compromising the performance and reliability of the formed device.

SUMMARY

Embodiments of the present disclosure provide an apparatus and methods for depositing and etching thin films with improved step coverage and reduced damage to underlying layers.

In some embodiments, the apparatus comprises a processing chamber equipped with a first and a second RF coil assemblies, which generate primary and secondary plasmas in a first and a second regions of the processing chamber. Additionally, the apparatus includes first and second electromagnet assemblies for independent control of magnetic field distribution. A removable biasable flux optimizer is disposed in the apparatus to modulate plasma distribution and directionality. The adjustable RF coils control the density of the primary and secondary plasmas. Furthermore, the apparatus supports various processing sequences, including deposition, etching, simultaneous deposition and etching, and Inductive coupled plasma (ICP) low energy deposition processes, which can be performed in a pre-programmed processing sequence.

The method for fabricating semiconductor devices using the disclosed apparatus includes several steps. In one embodiment, the method involves performing inductive coupled plasma (ICP) low energy deposition as the initial step to create a buffer layer. This ICP process utilizes an RF coil made of the same material as the sputtering target. The ICP process is induced by increasing the chamber pressure, intensifying the collisions between the primary and secondary plasmas in the second region of the chamber. Subsequently, a deposition step is carried out using the primary plasma generated by the first RF coil assembly to enhance step coverage. Finally, an etching step is performed using the secondary plasma generated by the second RF coil assembly to remove overhangs. These steps can be executed as a pre-programmed processing sequence, ensuring efficient and controlled fabrication of semiconductor devices. In one embodiment of the disclosure, a three-step process is provided, which includes an inductive coupled plasma (ICP) step for damage mitigation, followed by a deposition step for step coverage, and concludes with an etching step to remove overhangs. The three-step process is particularly advantageous for applications that require precise control over each process step and a more straightforward process flow.

In another embodiment, the plasma processing apparatus includes a combination of the inductive coupled plasma mode and the Simultaneous Deposition and Etching mode. The first step involves using the Inductive coupled plasma mode to create a thin buffer layer to protect the underlying dielectric material from the damages induced by the subsequent high-energy deposition step. The second step involves simultaneous deposition and etching, where the deposition process occurs simultaneously with the etching process.

In yet another embodiment, an optional etching step is added at the end of the inductive coupled plasma and Simultaneous Deposition and Etching sequence to provide further refinement if the simultaneous deposition and etching step was not sufficient to remove all overhangs.

Embodiments of the present disclosure provide several advantages over existing PVD systems, including improved step coverage, reduced damage to underlying layers, and tailored process sequences to meet specific application requirements.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

Figure 1:
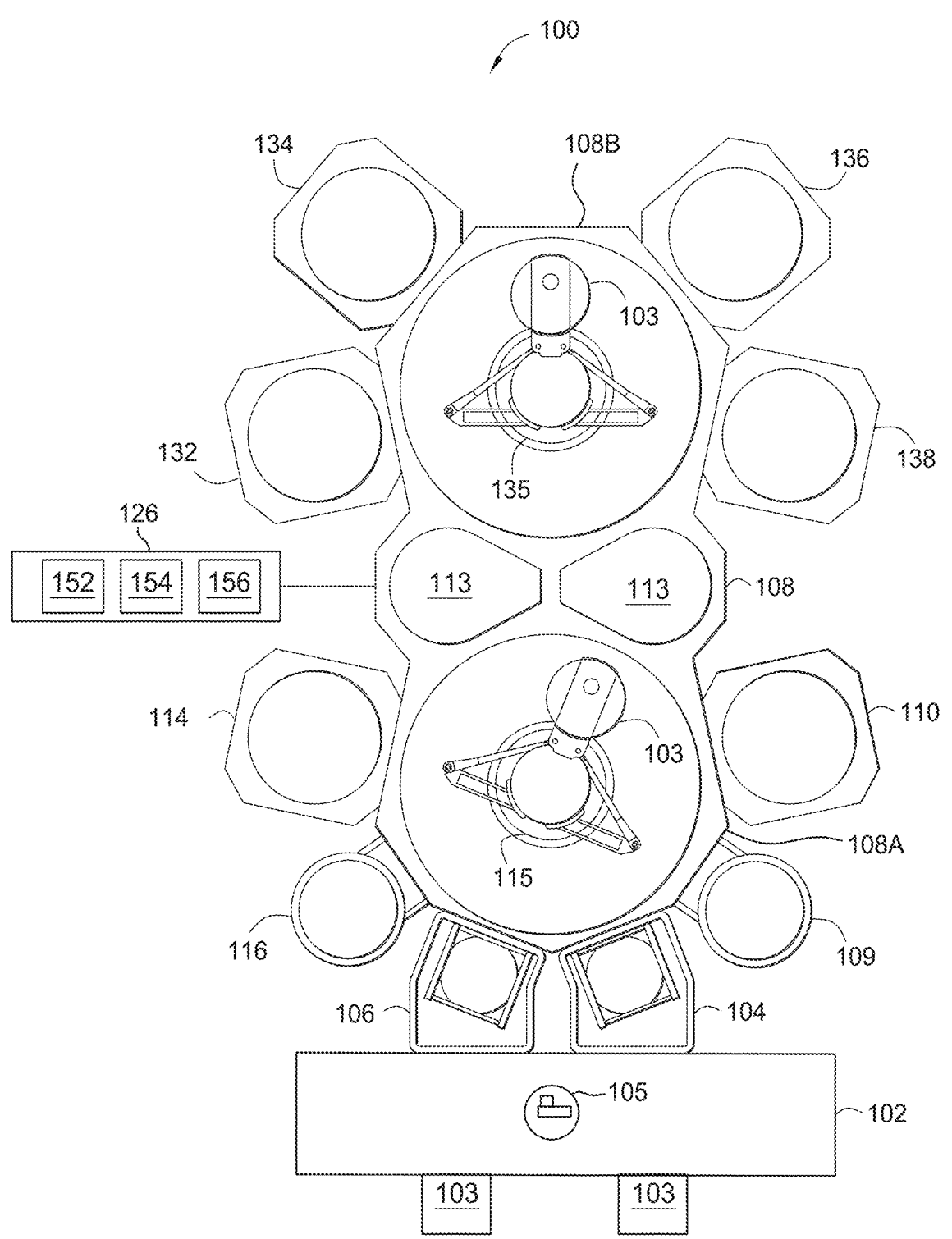
FIG. 1 illustrates a schematic top view of a multi-chamber processing system, according to at least one embodiment.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments of the present disclosure include an apparatus and methods forming thin films on a surface of a substrate that includes a plurality of features formed thereon. Embodiments of the invention generally provide a processing chamber used to perform a physical vapor deposition (PVD) process. In one embodiment, the process chamber design is adapted to deposit a desired material using a multistep PVD process. The processing chamber disclosed herein may be especially useful for depositing films so that they have an improved deposition uniformity, feature side wall coverage and feature bottom coverage. The processing chamber's design features may include at least two or more of: one or more inductive coil, one or more side wall electromagnets, an improved magnetron design, an improved substrate biasing configuration, and an improved process kit design.

Exemplary Processing System

FIG. 1 is a schematic top view of an exemplary processing system 100 (also referred to as a "processing platform"), according to certain embodiments. The processing system 100 generally includes an equipment front-end module (EFEM) 102 for loading substrates into the processing system 100, a first load lock chamber 104 coupled to the EFEM 102, a transfer chamber 108 coupled to the first load lock chamber 104, and a plurality of other chambers coupled to the transfer chamber 108 as described in detail below. The EFEM 102 generally includes one or more robots 105 that are configured to transfer substrates from the FOUPs 103 to at least one of the first load lock chamber 104 or the second load lock chamber 106. Proceeding counterclockwise around the transfer chamber 108 from the buffer portion 108A of the first load lock chamber 104, the processing system 100 includes a first degas chamber 109, a first pre-clean chamber 110, a first pass-through chamber 112, a second pass-through chamber 113, a second pre-clean chamber 114, a second degas chamber 116 and the second load lock chamber 106. The buffer portion 108A of the transfer chamber 108 includes a first robot 115 that is configured to transfer substrates to each of the load lock chambers 104, 106, the degas chambers 109, 116, the pre-clean chambers 110, 114 and the pass-through chambers 112, 113.

The back-end portion 108B of the transfer chamber 108 includes a second robot 135 that is configured to transfer substrates to each of the pass-through chambers 112, 113 and the processing chambers coupled to the back-end portion 108B of the processing system 100. The processing chambers can include a first processing chamber 132, a second processing chamber 134, a third processing chamber 136, and a fourth processing chamber 138. In general, the processing chambers 132, 134, 136, 138 can include at least one of an atomic layer deposition (ALD) chamber, chemical vapor deposition (CVD) chamber, physical vapor deposition (PVD) chamber, etch chamber, degas chamber, an anneal chamber, and other type of semiconductor substrate processing chamber. In some embodiments, one or more of the processing chambers 132, 134, 136, 138 are a PVD chamber that configured similar to the processing chamber 200 described below.

The buffer portion 108A and back-end portion 108B of the transfer chamber 108 and each chamber coupled to the transfer chamber 108 are maintained at a vacuum state. As used herein, the term "vacuum" may refer to pressures less than 760 Torr, and will typically be maintained at pressures near $10^{-5}$ Torr (i.e., $\sim10^{-3}$ Pa). However, some high-vacuum systems may operate below near $10^{-7}$ Torr (i.e., $\sim10^{-5}$ Pa). In certain embodiments, the vacuum is created using a rough pump and/or a turbomolecular pump coupled to the transfer chamber 108 and to each of the one or more process chambers (e.g., process chambers 109-138). However, other types of vacuum pumps are also contemplated.

A system controller 126, such as a programmable computer, is coupled to the processing system 100 for controlling one or more of the components therein. For example, the system controller 126 may control the operation of the processing chamber 200, which is described further below. In operation, the system controller 126 enables data acquisition and feedback from the respective components to coordinate processing in the processing system 100. The system controller 126 includes a programmable central processing unit (CPU) 152, which is operable with a memory 154 (e.g., non-volatile memory) and support circuits 156. The support circuits 156 (e.g., cache, clock circuits, input/output subsystems, power supplies, etc., and combinations thereof) are conventionally coupled to the CPU 152 and coupled to the various components within the processing system 100.

In some embodiments, the CPU 152 is one of any form of general purpose computer processor used in an industrial setting, such as a programmable logic controller (PLC), for controlling various monitoring system component and sub-processors. The memory 154, coupled to the CPU 152, is non-transitory and is typically one or more of readily available memory such as random access memory (RAM), read only memory (ROM), floppy disk drive, hard disk, or any other form of digital storage, local or remote.

Herein, the memory 154 is in the form of a computer-readable storage media containing instructions (e.g., non-volatile memory), that when executed by the CPU 152, facilitates the operation of the processing system 100. The instructions in the memory 154 are in the form of a program product such as a program that implements the methods of the present disclosure (e.g., middleware application, equipment software application, etc.). The program code may conform to any one of a number of different programming languages.

In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

Processing Chamber Example(s)

Figure 2A:
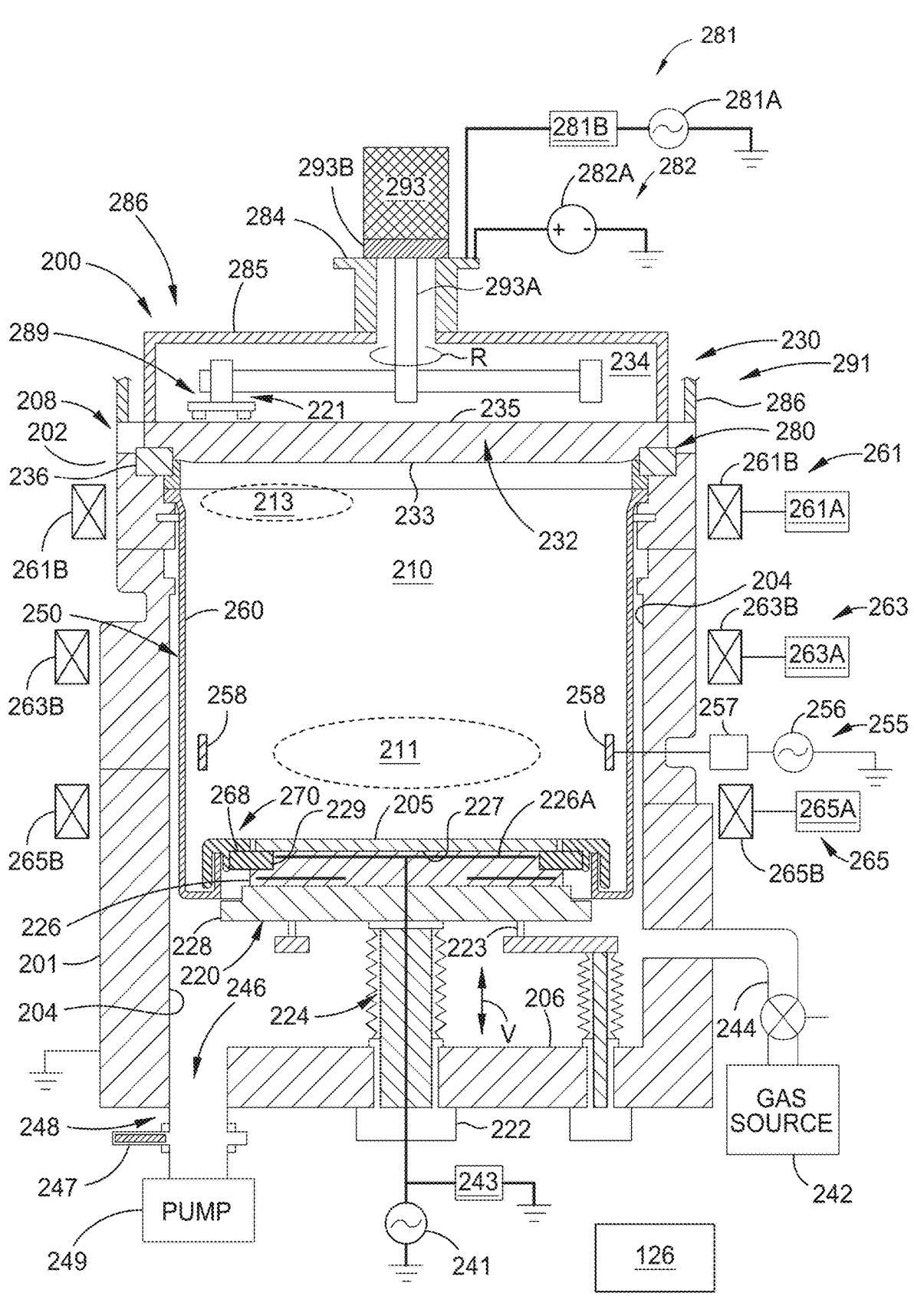
FIG. 2A is a cross-sectional view of a chamber according to one embodiment of the disclosure.

FIG. 2A illustrates an exemplary processing chamber 200 having an upper process assembly 208, a process kit 250 and a pedestal assembly 220, which are all configured to process a substrate 205 disposed in a processing region 210. The process kit 250 includes a one-piece grounded shield 260, a deposition ring 268, a cover ring 270, and an isolator ring assembly 280. In the version shown, the processing chamber 200 comprises a sputtering chamber, also called a PVD chamber, capable of depositing a single or multi-compositional material from a sputtering target 232 on the substrate 205. The processing chamber 200 may also be used to deposit aluminum (Al), copper (Cu), nickel (Ni), platinum (Pt), hafnium (Hf), silver (Ag), chrome (Cr), gold (Au), molybdenum (Mo), silicon (Si), ruthenium (Ru), tantalum (Ta), tantalum nitride (TaN), tantalum carbide (TaC), titanium nitride (TiN), tungsten (W), tungsten nitride (WN), lanthanum (La), alumina ($AlO_x$), lanthanum oxides ($LaO_x$), nickel platinum alloys (NiPt), and titanium (Ti), and or combination thereof. Such processing chambers are available from Applied Materials located in Santa Clara, Calif. It is contemplated that other processing chambers including those from other manufacturers may be adapted to benefit from one or more of the embodiments of the disclosure described herein.

The processing chamber 200 includes a chamber body 201 having sidewalls 204, a bottom wall 206, and an upper process assembly 208 that enclose a processing region 210 or plasma zone. The chamber body 201 is typically fabricated from welded plates of stainless steel or a unitary block of aluminum. In one embodiment, the sidewalls comprise aluminum and the bottom portion of the chamber includes one or more walls that are formed from a stainless steel plate. The sidewalls 204 generally contain a slit valve (not shown) to provide for entry and egress of a substrate 205 from the processing chamber 200. Components in the upper process assembly 208 of the processing chamber 200 in cooperation with the grounded shield 260, pedestal assembly 220 and cover ring 270 confine the plasma formed in the processing region 210 to the region above the substrate 205.

A pedestal assembly 220 is supported from the bottom wall 206 of the processing chamber 200. The pedestal assembly 220 supports a deposition ring 268 along with the substrate 205 during processing. The pedestal assembly 220 is coupled to the bottom wall 206 of the processing chamber 200 by a lift mechanism 222, which is configured to move the pedestal assembly 220 between an upper processing position and lower transfer position. Additionally, in the lower transfer position, lift pins 223 are moved through the pedestal assembly 220 to position the substrate a distance from the pedestal assembly 220 to facilitate the exchange of the substrate with a substrate transfer mechanism disposed exterior to the processing chamber 200, such as a single blade robot (not shown). A bellows 224 is typically disposed between the pedestal assembly 220 and the bottom wall 206 to isolate the processing region 210 from the interior of the pedestal assembly 220 and the exterior of the chamber.

The pedestal assembly 220 generally includes a support 226 sealingly coupled to a platform housing 228. The platform housing 228 is typically fabricated from a metallic material such as stainless steel or aluminum. A cooling plate (not shown) is generally disposed within the platform housing 228 to thermally regulate the support 226.

The support 226 may be comprised of aluminum or ceramic. The substrate support 226 has a substrate receiving surface 227 that receives and supports the substrate 205 during processing, the substrate receiving surface 227 being substantially parallel to a sputtering surface 233 of the sputtering target 232. The support 226 also has a peripheral edge 229 that terminates before an overhanging edge 205A of the substrate 205. The support 226 may be an electrostatic chuck, a ceramic body, a heater or a combination thereof. In one embodiment, the support 226 is an electrostatic chuck that includes a dielectric body having an electrode 226A, embedded therein. The dielectric body is typically fabricated from a high thermal conductivity dielectric material such as pyrolytic boron nitride, aluminum nitride, silicon nitride, alumina or an equivalent material. Other aspects of the pedestal assembly 220 and support 226 are further described below. In one embodiment, the electrode 226A is configured so that when a DC voltage is applied to the electrode 226A, by an electrostatic chuck power supply 243, a substrate 205 disposed on the substrate receiving surface 227 will be electrostatically chucked thereto to improve the heat transfer between the substrate 205 and the support 226. In another embodiment, a bias source 241 is also coupled to the electrode 226A so that a voltage can be maintained on the substrate during processing to affect the plasma interaction with the surface of the substrate 205.

A program (or computer instructions) readable by the system controller 126 determines which tasks are performable on a substrate. Preferably, the program is software readable by the system controller 126 that includes code to perform tasks relating to monitoring, execution and control of the movement and various process recipe tasks and recipe steps being performed in the processing system 100 and processing chamber 200. For example, the system controller 126 can comprise program code that includes a substrate positioning instruction set to operate the pedestal assembly 220; a gas flow control instruction set to operate gas flow control valves to set a flow of sputtering gas to the processing chamber 200; a gas pressure control instruction set to operate a throttle valve or gate valve to maintain a pressure in the processing chamber 200; a temperature control instruction set to control a temperature control system (not shown) in the pedestal assembly 220 or sidewalls 204 to set temperatures of the substrate or sidewalls 204, respectively; and a process monitoring instruction set to monitor the process in the processing chamber 200.

The processing chamber 200 also contains a process kit 250 which comprises various components that can be easily removed from the processing chamber 200, for example, to clean sputtering deposits off the component surfaces, replace or repair eroded components, or to adapt the processing chamber 200 for other processes. In one embodiment, the process kit 250 comprises an isolator ring assembly 280, a grounded shield 260 and a deposition ring 268 for placement about a peripheral edge 229 of the support 226 that terminates before an overhanging edge of the substrate 205.

The upper process assembly 208 may also comprise an RF source 281, a direct current (DC) source 282, an adaptor 202, a motor 293, and a lid assembly 230. The lid assembly 230 generally comprises a sputtering target 232, a magnetron system 289 and a lid enclosure 291. The upper process assembly 208 is supported by the sidewalls 204 when in a closed position, as shown in FIG. 2A. A ceramic target isolator 236 is disposed between the isolator ring assembly 280, the sputtering target 232 and adaptor 202 of the lid assembly 230 to prevent vacuum leakage therebetween. The adaptor 202 is sealably coupled to the sidewalls 204, and is configured to help with the removal of the upper process assembly 208 and isolator ring assembly 280.

When in the processing position, the sputtering target 232 is disposed adjacent to the adaptor 202, and is exposed to the processing region 210 of the processing chamber 200. The sputtering target 232 contains material that is deposited on the substrate 205 during a PVD, or sputtering, process. The isolator ring assembly 280 is disposed between the sputtering target 232 and the shield 260 and chamber body 201 to electrically isolate the sputtering target 232 from the shield 260 and chamber body 201.

During processing, the sputtering target 232 is biased relative to a grounded region of the processing chamber (e.g., chamber body 201 and adaptor 202) by a power source disposed in the RF source 281 and/or the direct current (DC) source 282. It is believed that by delivering RF energy and DC power to the sputtering target 232 during a high pressure PVD process, significant process advantages can be achieved over conventional low pressure DC plasma processing techniques when used in conjunction with sputtering materials such as titanium, copper, nickel, ruthenium, aluminum, tantalum, molybdenum, and tungsten to name just a few. In one embodiment, the RF source 281 comprises an RF power source 281A and an RF match 281B that are configured to efficiently deliver RF energy to the sputtering target 232. In one example, the RF power source 281A is capable of generating RF currents at a frequency of between about 13.56 MHz and about 228 MHz at powers between about 0 and about 5 kWatts. In one example, the DC power supply 282A in the DC source 282 is capable of delivering between about 0 and about 50 kWatts of DC power.

The central portion of the processing chamber 200 includes an inductive coil assembly 255 that is positioned within a central region of the process kit 250, and is configured to form an inductively coupled plasma 211 during processing that is used to ionize atoms ejected from the sputtering target 232 and/or ionize process gases disposed within the processing region 210 during processing. The inductive coil assembly 255 includes an RF power source 256 and an impedance match 257 that are coupled to a RF coil 258, which is disposed within a central portion of the processing region 210 of the processing chamber 200. In some embodiments, the RF coil 258 is positioned at a vertical midpoint in the processing region 210, or at a position between the vertical midpoint and the surface of the substrate 205. The vertical mid-point being defined as the mid-point distance between the substrate receiving surface 227 of the pedestal assembly 220 and the target 232. In some embodiments, the RF coil 258 includes a single turn coil that is formed from a metal, where a first end of the single turn coil is coupled to RF power source 256 through the impedance match 257 and a second end that is coupled to a ground reference. In one configuration, the RF coil 258 is formed from a conductive material that is made of the same material as the sputtering target 232. In some configurations, the RF power source 256 is capable of generating RF currents in RF coil 258 at a frequency of between about 13.56 MHz and about 228 MHz at powers between about 0 and about 5 kWatts.

In some embodiments, the processing chamber 200 also includes one or more auxiliary electromagnet assemblies vertically aligned around the processing chamber, such as a first electromagnet assembly 261, a second electromagnet assembly 263, a third electromagnet assembly 265. In some embodiments, the first, second, and third electromagnet assemblies each include a separate current source so that each assembly can separately generate a magnetic field that is configured to confine and/or control the movement of electrons and ions generated in a plasma formed in the processing region 210 of the processing chamber.

In some embodiments, the first electromagnet assembly 261 comprises a first current source 261A configured to bias a first magnetic coil assembly 261B. The first magnetic coil assembly 261B is positioned near the sputtering target 232, configured to modulate the magnetron controlled plasma 213. The second electromagnet assembly 263 comprises a second current source 263A configured to bias a second magnetic coil assembly 263B. The second magnetic coil assembly 263B is positioned next to the inductive coil assembly 255, configured to modulate the inductively coupled plasma 211. The third electromagnet assembly 265 comprises a third current source 265A configured to bias a third magnetic coil assembly 265B. The third magnetic coil assembly 265B is positioned near the support 226, configured to modulate the plasma near the surface of the substrate 205. In some configurations, the first, second, and third current sources 261A, 263A, and 265A are capable of generating a DC or RF current or voltage at a power between about 0 and about 5 kWatts.

In operation, the one or more electromagnet assemblies 261, 263, and 265 are vertically distributed and positioned outside the process kit 250 to generate magnetic field within the processing region 210 to help alter and/or shape the radial distribution of the plasma formed with the processing region 210 during processing. In some embodiments, the one or more electromagnet assemblies comprise a single electromagnet, a pair of electromagnets, or a quadruple electromagnet array. The quadruple electromagnet array includes four solenoidal coils wrapped generally circularly symmetrically about the central axis 294 of the processing chamber 200. In one configuration, the four electromagnets are configured as top inner magnet (TIM), top outer magnet (TOM), bottom inner magnet (BIM), and bottom outer magnet (BOM) (not shown). The magnetic field generated by the quadruple electromagnet array is modulated by controlling the direction and magnitude of electric current flowing through each coil, or selectively powering a particular combination of coils, e.g., the outer/inner coils or the top/bottom coils.

During processing, a gas, such as argon, is supplied to the processing region 210 from a gas source 242 via conduits 244. The gas source 242 may comprise an inert gas such as argon, krypton, helium or xenon, which is capable of energetically impinging upon and sputtering material from the sputtering target 232 and/or surface of the substrate 205 based on a bias applied by the bias source 241. The gas source 242 may also include a reactive gas, such as one or more of an oxygen-containing gas or a nitrogen-containing gas, which is capable of reacting with the sputtering material to form a layer on a substrate. Spent process gas and byproducts are exhausted from the processing chamber 200 through exhaust ports 246 that receive spent process gas and direct the spent process gas to an exhaust conduit 248 having an adjustable position gate valve 247 to control the pressure in the processing region 210 in the processing chamber 200. The exhaust conduit 248 is connected to one or more exhaust pump 249, such as a cryopump. Typically, the pressure of the sputtering gas in the processing chamber 200 during processing is set to sub-atmospheric levels, such as a vacuum environment, for example, a pressure of about 0.6 mTorr to about 400 mTorr. In one embodiment, the processing pressure is set to about 20 mTorr to about 100 mTorr. A plasma is formed between the substrate 205 and the sputtering target 232 from the gas. Ions within the plasma are accelerated toward the sputtering target 232 and cause material to become dislodged from the sputtering target 232. The dislodged target material is deposited on the substrate.

The lid enclosure 291 generally comprises a conductive wall 285, a center feed 284 and shielding 286 (FIG. 2A). In this configuration, the conductive wall 285, the center feed 284, the sputtering target 232 and a portion of the motor 293 enclose and form a back region 234. The back region 234 is a sealed region disposed on the back side of the sputtering target 232 and is generally filled with a flowing liquid during processing to remove the heat generated at the sputtering target 232 during processing. In one embodiment, the conductive wall 285 and center feed 284 are configured to support the motor 293 and magnetron system 289, so that the motor 293 can rotate the magnetron system 289 during processing. In one embodiment the motor 293 is electrically isolated from the RF or DC power delivered from the power supplies by use of a dielectric layer 293B, such as Delrin, G10, or Ardel.

The shielding 286 may comprise one or more dielectric materials that are positioned to enclose and prevent the RF energy delivered to the sputtering target 232 from interfering with and affecting other processing chambers disposed in the processing system 100 (FIG. 1). In one configuration, the shielding 286 may comprise a Delrin, G10, Ardel or other similar material and/or a thin grounded sheet metal RF shield.

To provide efficient sputtering, a magnetron system 289 is positioned in back of the sputtering target 232 in the upper process assembly 208 to create a magnetic field in the processing region 210 adjacent the sputtering surface 233 of the sputtering target 232, which creates a magnetron controlled plasma 213. The magnetic field by magnetron system 289 is created to trap electrons and ions to thereby increase the plasma density over one or more regions of the target 232, and to thereby also increase target utilization, control deposition uniformity and the sputtering rate. According to one embodiment of the disclosure, the magnetron system 289 includes a source magnetron assembly 221 that comprises an outer pole (not shown) and an inner pole (not shown). The magnetron system 289 is rotated about the central axis 294 of the processing chamber 200 by use of the motor 293. In some embodiments, a "closed loop" magnetron configuration is formed within the magnetron system 289 such that the outer pole (not shown) of the magnetron surrounds the inner pole (not shown) of the magnetron forming a gap between the poles that is a continuous loop. In the closed loop configuration, the magnetic fields that emerge and reenter through a surface of the sputtering target form a "closed loop" pattern can be used to confine electrons near the surface of the sputtering target in a closed pattern, which is often called a "racetrack" type pattern. A closed loop, as opposed to the open-loop, magnetron configuration is able to confine electrons and generate a high density plasma near the sputtering surface 233 of the sputtering target 232 to increase the sputtering yield. In some other embodiments, an "open loop" magnetron configuration is formed within the magnetron system 289 such that the outer pole of the magnetron surrounds the inner pole of the magnetron forming a gap between the poles that is a continuous loop. In an open loop magnetron configuration, the electrons trapped between the inner and outer poles will migrate, leak out and escape from the B-fields created at open ends of the magnetron, thus only holding the electrons for a short period of time during the sputtering process due to the reduced confinement of the electrons. It has been found that the use of an open loop magnetron configuration, can provide significant step coverage improvements and provide an improved material composition uniformity across the substrate surface, when used in conjunction with the RF and DC sputtering of multi-compositional targets described herein.

In some embodiments of the processing chamber 200, the bias source 241 is coupled between an electrode and RF ground to adjust the bias voltage on the substrate 205 during processing to control the degree of bombardment on the substrate surface. In some embodiments, the electrode is disposed adjacent to the substrate receiving surface 227 of a support 226, and comprises the electrode 226A. In a PVD reactor, tuning of the bombardment of the substrate surface by the control of the impedance of the electrode to ground, will affect step coverage, overhang geometry and deposited film's properties, such as grain size, film stress, crystal orientation, film density, roughness, feature bottom coverage, feature step coverage and in some cases can effect film composition. Therefore, the bias source 241 can thus be used to alter the deposition rate, the etching rate and even the composition of a multi-compositional film at the substrate surface. In one embodiment, the bias source 241 is employed to enable deposition or etching of a deposited film, by the appropriate adjustment of impedance of the electrode/substrate to ground. In one embodiment of the bias source 241, the bias source 241 that has a variable capacitor tuning circuit with a feedback circuit to control the properties of a deposited metal or non-metal layer on a substrate.

In some embodiments, the bias source 241 includes by an RF source (not shown) and an impedance match (not shown) that are coupled to the electrode 226A. In some embodiments, the RF power source is capable of generating RF currents at a frequency of between about 11 MHz and about 228 MHz, such as 13.56 MHz at powers between about 0 and about 5 kWatts.

Biasable Flux Optimizer

Figure 2B:
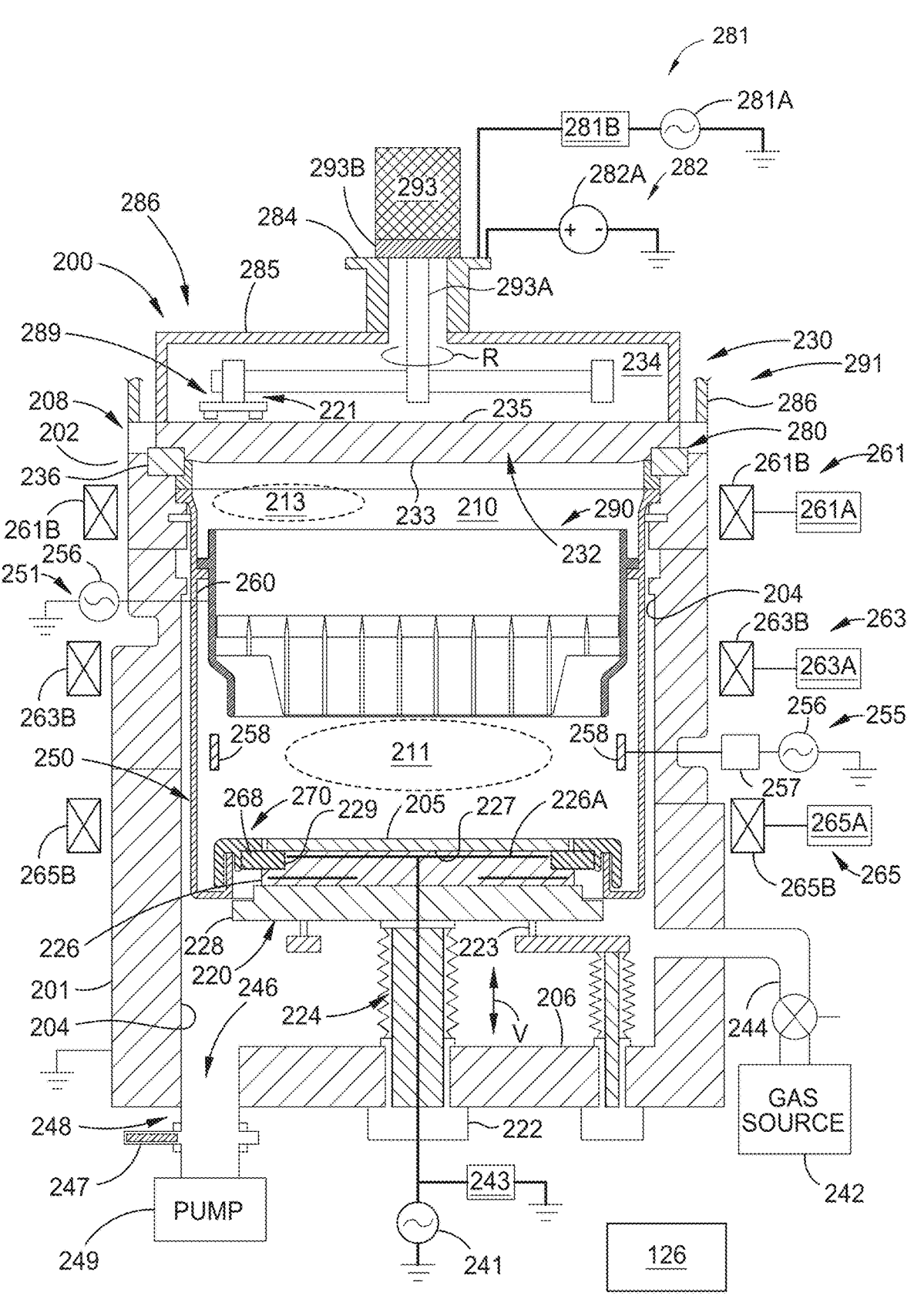
FIG. 2B is a cross-sectional view of a chamber according to another embodiment of the disclosure.

In some embodiments, as shown in FIG. 2B, a processing chamber 200 is modified to include a biasable flux optimizer 290 for further control of the ion distribution and directionality in the chamber. The biasable flux optimizer 290 is also referred to herein as a collimator in some embodiments. In one implementation, a control over ion flux directionality of sputtered material may be achieved by positioning the biasable flux optimizer 290 between the sputtering target 232 and the pedestal assembly 220. A power source 251 is coupled to the biasable flux optimizer 290 to provide a bias potential to energize the biasable flux optimizer 290 and attract sputtered metal ions formed in the plasma.

Figure 3A:
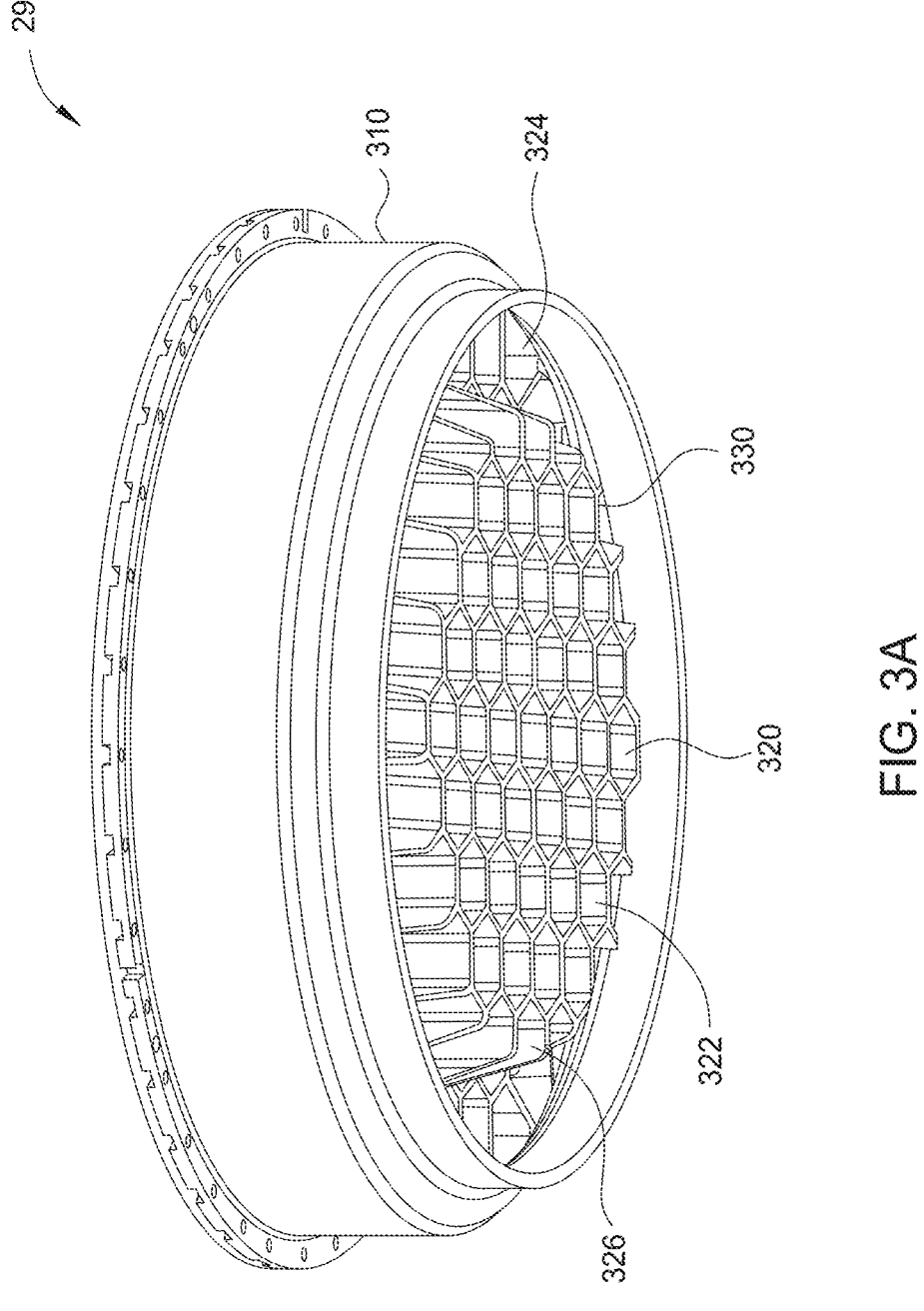
FIG. 3A depicts a perspective view of a biasable flux optimizer in accordance with implementations of the present disclosure.
Figure 3B:
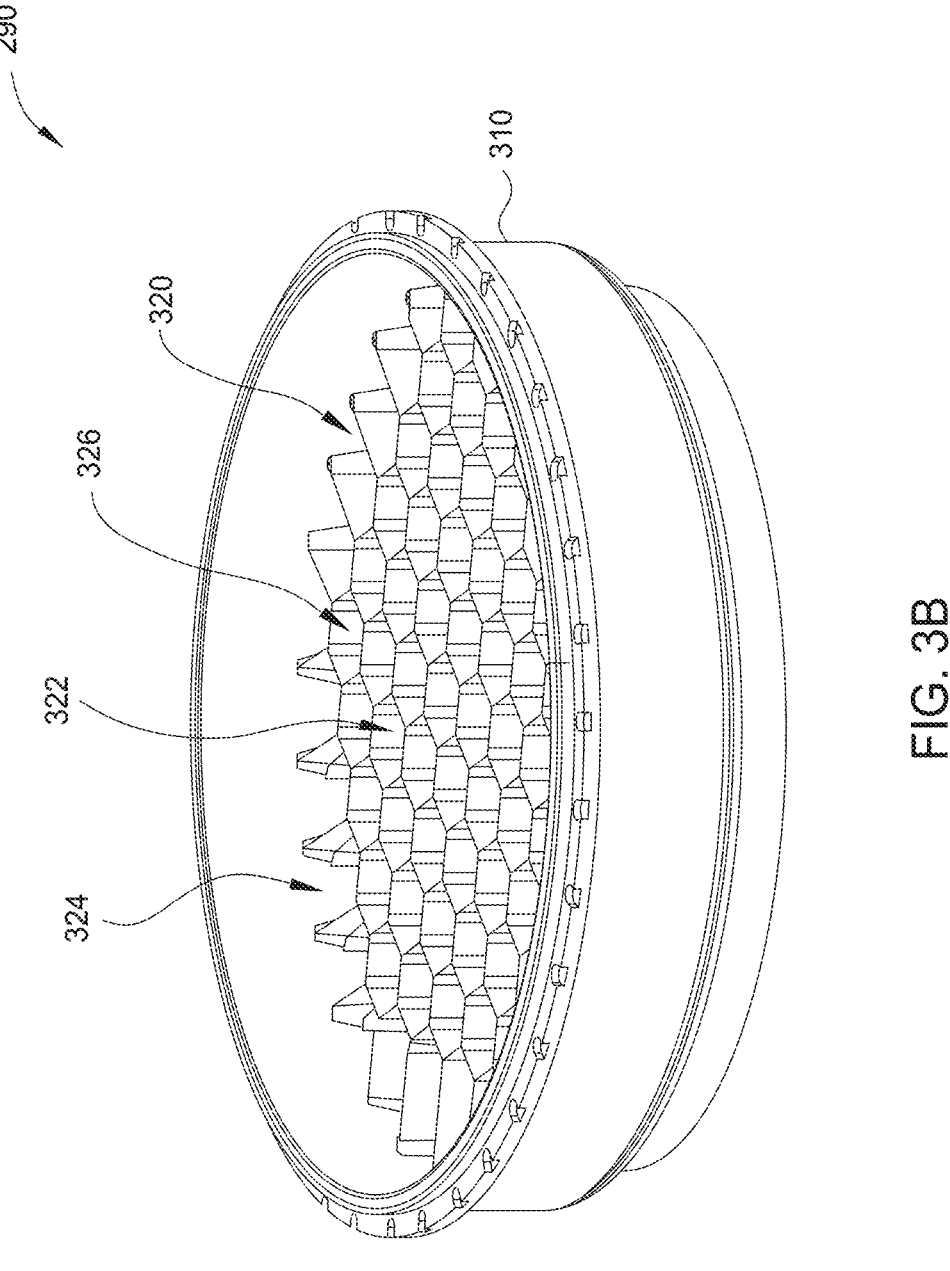
FIG. 3B depicts another perspective view of a biasable flux optimizer in accordance with implementations of the present disclosure.
Figure 3C:
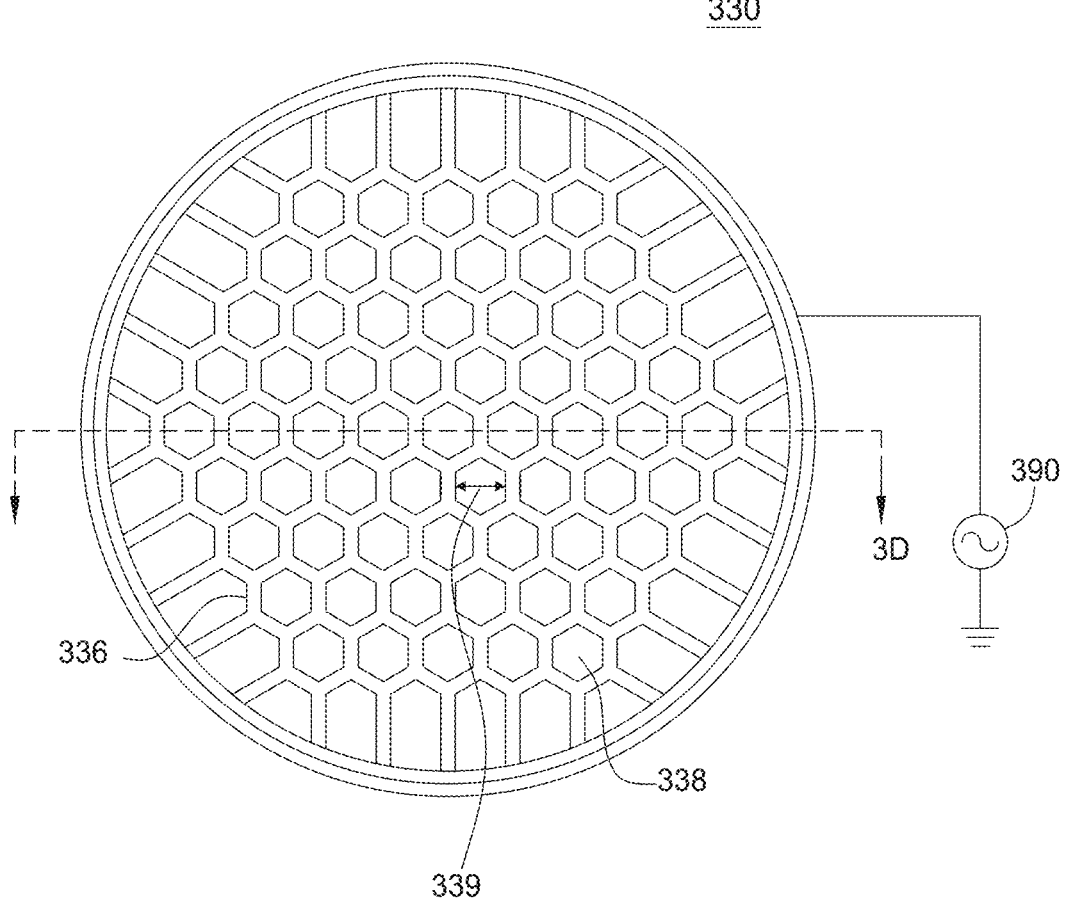
FIG. 3C depicts a top view of the biasable flux optimizer of FIGS. 3A-3B.

FIG. 3A depicts a perspective view of a biasable flux optimizer 290 in accordance with implementations of the present disclosure. FIG. 3B depicts another perspective view of the biasable flux optimizer 290 in accordance with implementations of the present disclosure. FIG. 3C depicts a top view of the biasable flux optimizer 290 of FIG. 3A-3B that may be disposed in the processing chamber 200 of FIG. 2B. The biasable flux optimizer 290 includes a shield portion 310 coupled with a collimator portion 320. The collimator portion 320 includes a plurality of apertures to direct and allow the passage of gas and/or material flux therethrough within the processing chamber 200.

The collimator portion 320 may be mechanically and electrically coupled to the one-piece shield portion 310. In one implementation, the collimator portion 320 is integral to the one-piece shield portion 320, as shown in FIGS. 3A-3B. In one implementation, the collimator portion 320 is welded to the one-piece shield portion 310. In one implementation, the collimator portion 320 and the one-piece shield portion 310 are machined from a single mass of material. In one implementation, the collimator portion 320 and the one-piece shield portion 310 are comprised of a material selected from aluminum, titanium, copper, and stainless steel. Alternatively, the one-piece shield portion 310 and the collimator portion 320 are formed as separate pieces and coupled together using suitable attachment means, such as bolting, riveting or welding. In one implementation, the collimator portion 320 may be electrically floating within the processing chamber 200. In one implementation, the collimator portion 320 may be coupled to an electrical power source.

As shown in FIG. 3C, the collimator portion 320 is generally a body or a honeycomb structure 330 having walls 336 defining and separating hexagonal aperture(s) 338 in a close-packed arrangement. An aspect ratio of the hexagonal apertures 338 may be defined as the depth of the hexagonal aperture 338 (equal to the thickness of the collimator) divided by the width 339 of the hexagonal aperture 338. In one implementation, the thickness of the walls 336 is between about 0.06 inches (1.524 millimeters) and about 0.18 inches (4.572 millimeters). In one implementation, the thickness of the walls 336 is between about 0.12 inches (3.048 millimeters) and about 0.15 inches (3.81 millimeters). In one implementation, the collimator portion 320 is comprised of a material selected from aluminum, titanium, copper, and stainless steel.

The honeycomb structure 330 of the collimator portion 320 may serve as an integrated flux optimizer to improve the flow path, ion fraction, and ion trajectory behavior of ions passing through the collimator portion 320. In one implementation, the walls 336 adjacent to a shield portion have a tapered entrance portion and a radius. The one-piece shield portion 310 of the collimator portion 320 may assist in the installation of the collimator portion 320 into the processing chamber 200.

In one implementation, the collimator portion 320 may be machined from a single mass of aluminum. The collimator portion 320 may optionally be coated or anodized. Alternatively, the collimator portion 320 may be made from other materials compatible with the processing environment, and may be comprised of one or more sections. In some implementations, the walls 336 of the collimator portion 320 may be textured (e.g., bead blasted) to improve adhesion of high stress films (e.g., copper alloys) to the walls 336.

In one implementation, the collimator portion 320 may be electrically biased in bipolar mode to control the direction of the ions passing through the collimator portion 320. For example, as shown in FIG. 3C, a controllable direct current (DC) or alternating current (AC) power source 390 may be coupled to the collimator portion 320 to provide an alternating pulsed positive or negative voltage to the collimator portion 320 to bias the collimator portion 320.

The collimator portion 320 functions as a filter to trap ions and neutral species that are emitted from the material from the sputtering target 232 at angles exceeding a selected angle, near normal relative to the substrate 205. The hexagonal apertures 338 of the collimator portion 320 are designed to allow a different percentage of ions emitted from a center or a peripheral region of the material from the sputtering target 232 to pass through the collimator portion 320. As a result, both the number of ions and the angle of arrival of ions deposited onto peripheral regions and center regions of the substrate 205 are adjusted and controlled. Therefore, material may be more uniformly sputter deposited across the surface of the substrate 205. Additionally material may be more uniformly deposited on the bottom and sidewalls of high aspect ratio features, particularly high aspect ratio vias and trenches located near the periphery of the substrate 205.

Figure 3D:
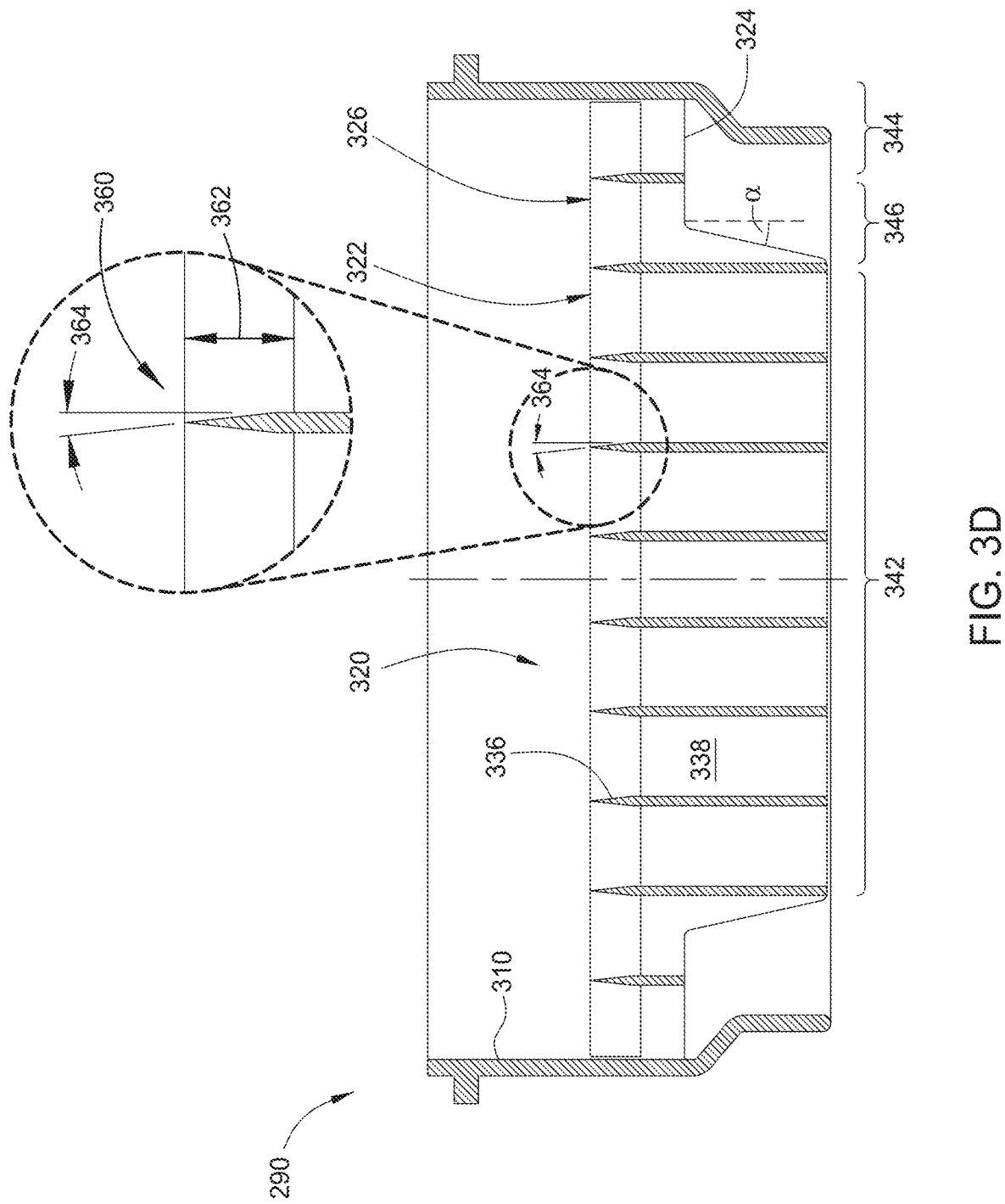
FIG. 3D depicts a cross-sectional view of the biasable flux optimizer of FIGS. 3A-3B in accordance with implementations of the present disclosure.

FIG. 3D depicts a cross-sectional view of the biasable flux optimizer 290 of FIGS. 3A-3B in accordance with implementations of the present disclosure. The collimator portion 320 includes the body or honeycomb structure 330 having a central region 342 having a first plurality of apertures 322 with a high aspect ratio, such as from about 2.5:1 to about 3:1. The aspect ratio of a second plurality of apertures 324 of the collimator portion 320 in an outer peripheral region 344 decreases relative to the first plurality of apertures 322 in the central region 342. In one implementation, the second plurality of apertures 324 in the outer peripheral region 344 have an aspect ratio of from about 1:1 to about 2:1. In one implementation, the second plurality of apertures 324 in the outer peripheral region 344 has an aspect ratio of about 1:1. A higher aspect ratio allows for more apertures in the central region 342 of the collimator portion 320. In one implementation, the central region includes 61 apertures.

In one implementation, the radial decrease of the hexagonal apertures 338 is accomplished by providing a third plurality of apertures 326 in a transitional region 346 disposed between the central region 342 and the outer peripheral region 344. The walls 336 defining the third plurality of apertures 326 are cut along a predetermined angle "α" so that the transitional region 346 forms a conical shape surrounding the first plurality of apertures 322. In one implementation, the predetermined angle α is between 15 degrees and 45 degrees. The transitional region 346 advantageously provides a circular profile of apertures in the central region 342 that overcomes the six-point deposition near an edge of the substrate 205 due to shadowing caused by corners of a conventional hexagonal collimator.

Upper portions of the walls 336 defining the hexagonal apertures 338 have an entrance portion 360 to decrease a rate at which the hexagonal apertures 338 are clogged by sputtered material. The entrance portion 360 has a tapered shape. The entrance portion 360 extends a predetermined distance 362 into the hexagonal aperture 338 and is formed at a predetermined angle 364. In one implementation, the predetermined distance 362 is between about 0.15 inches (3.81 millimeters) to about 1 inch (2.54 centimeters) and the predetermined angle 364 is between about 2 degrees and about 16 degrees. In one implementation, the predetermined distance 362 and the predetermined angle 364 are about 1 inch (2.54 centimeters) and 2.5 degrees respectively.

Processing Methods

Figure 4A:
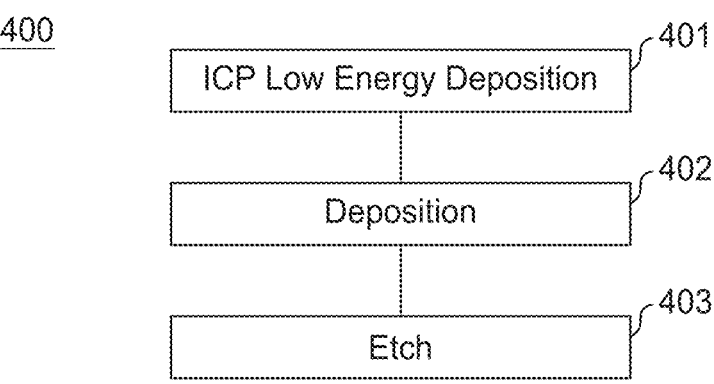
FIGS. 4A-4C illustrate various processing sequences, according to one or more embodiments described herein.
Figure 4B:
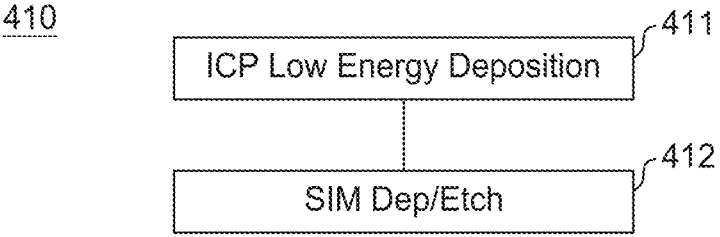
Figure 4C:
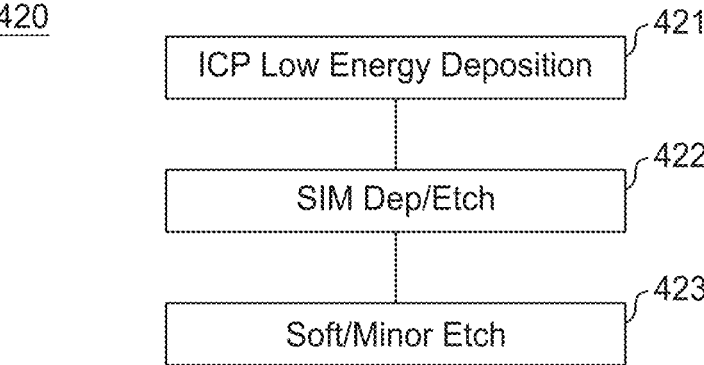

FIGS. 4A-4C illustrate some embodiments of processing sequences described herein. Each processing sequence is represented by a flow chart showing the sequence of processing steps, including the relevant process modes and any additional steps, such as an optional etching step. FIG. 4A illustrates a three-step process 400, starting from ICP low energy deposition 401 followed by deposition 402 and etching 403. FIG. 4B illustrates a two-step process 410, combining deposition and etching in a synchronized single step 412, to enable high throughput manufacturing. FIG. 4C illustrates a soft and minor etch 423 performed after the simultaneous deposition and etching 422 to reshape the surface profile.

Figure 5A:
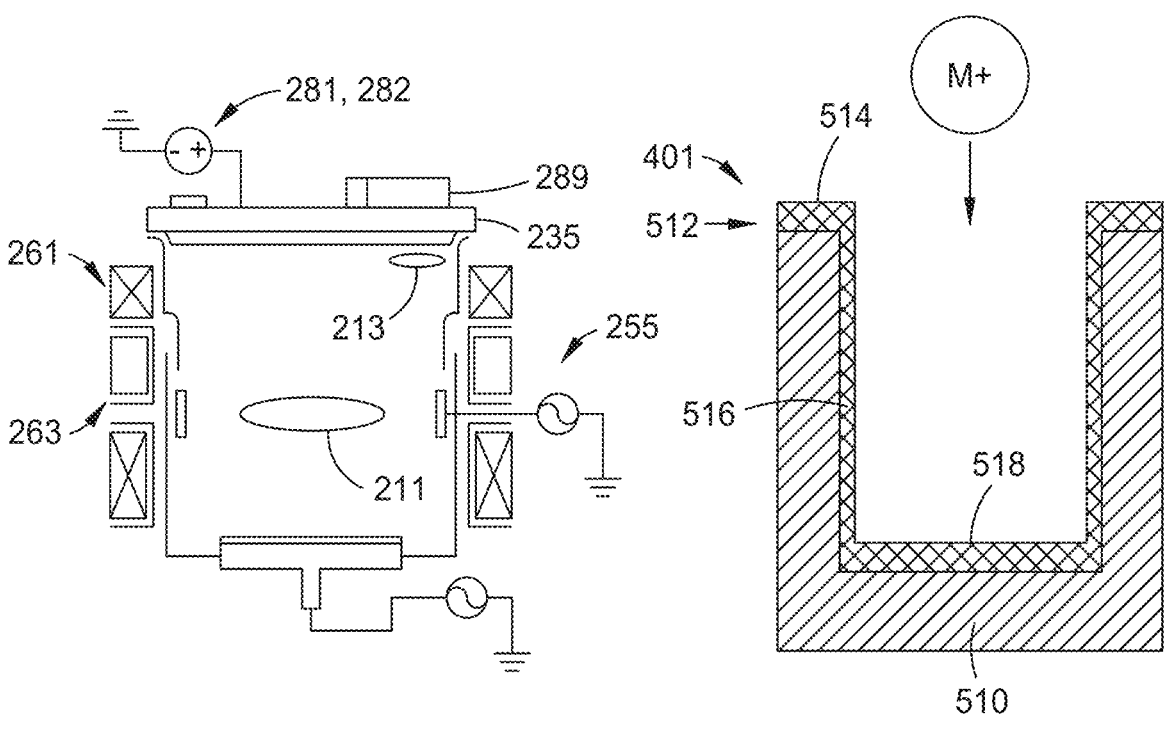
FIGS. 5A-5D illustrate aspects of various chamber processing modes, according to one or more embodiments described herein.
Figure 5B:
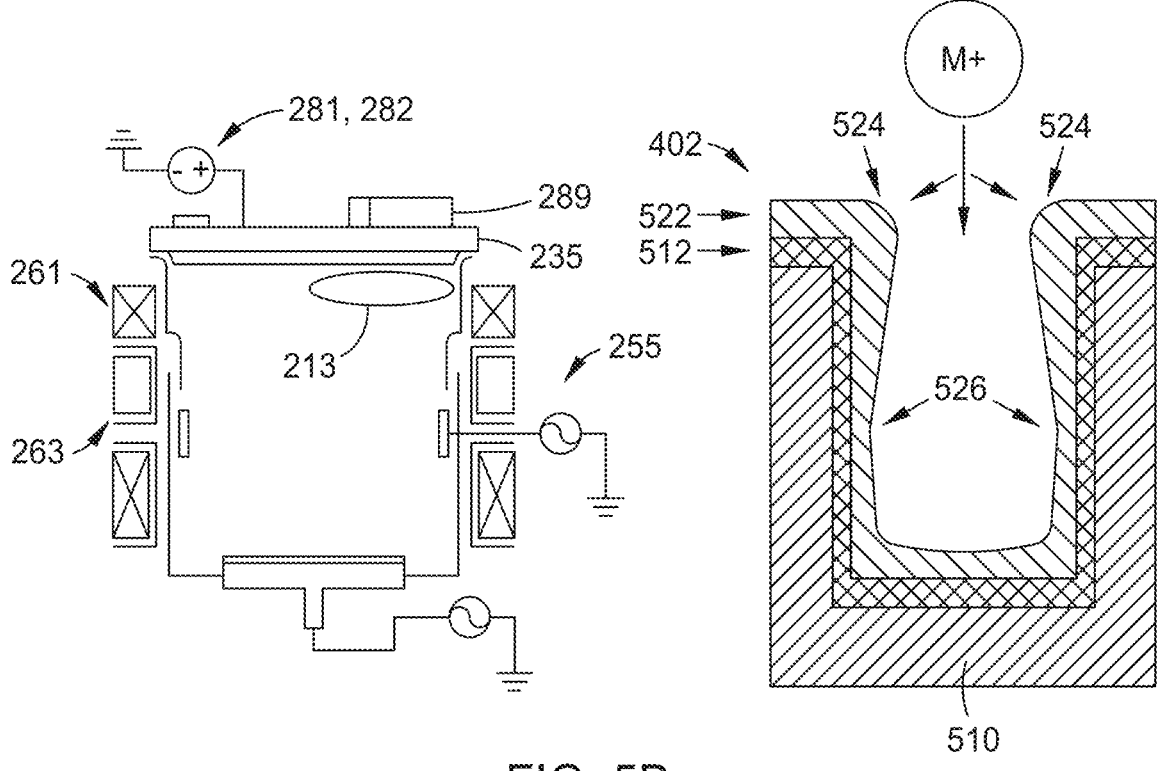
Figure 5C:
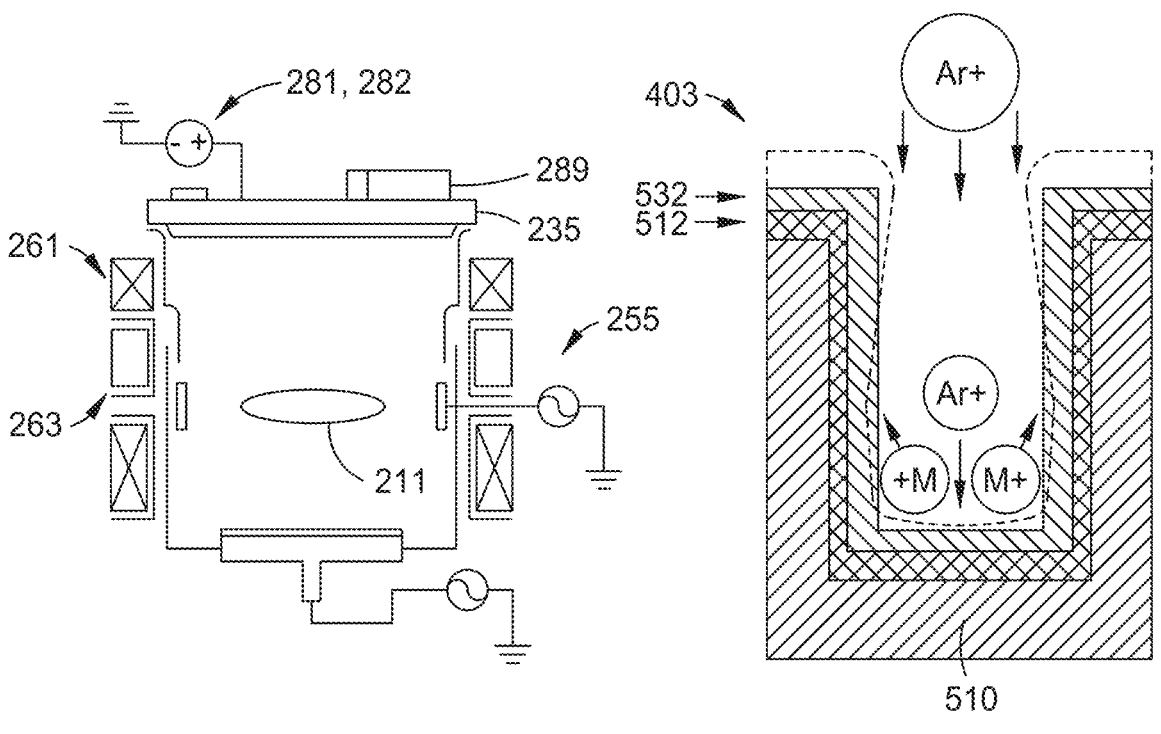
Figure 5D:
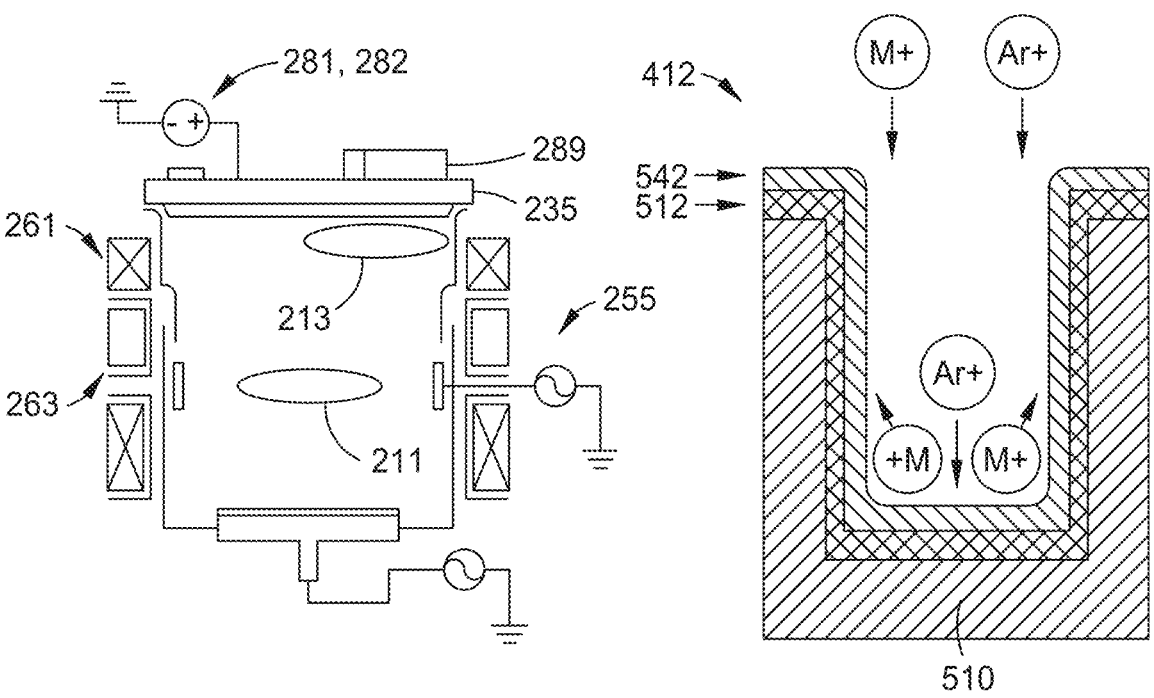

FIGS. 5A-5D illustrate some embodiments of processing modes described herein. Each mode is represented by a schematic diagram showing the relevant components of the processing chamber and the plasma generated during processing. The cross section illustration positioned next to the chamber diagram illustrate the corresponding plasma chemistry in each mode and the resulted modification, i.e., subtraction or addition, to device features. FIG. 5A illustrates a low energy magnetron and ICP deposition process, which is also referred to herein as simply the ICP deposition process. FIG. 5B illustrates a magnetron deposition process. FIG. 5C illustrates the ICP etching and re-sputtering process. FIG. 5D illustrates the simultaneous deposition and etching process, synchronized in a single step. Embodiments of the processing chamber, along with the optional biasable flux optimizer, offers controllability for inductively coupled plasma 211 and the magnetron controlled plasma 213 that combined to accommodate various processing modes and sequences.

In some embodiments, a process sequence of ICP-Deposition-Etch method 400 can be performed using the processing chamber 200 (FIG. 4A). This process sequence involves generating an inductive coil generated plasma (also referred to herein as an inductively coupled plasma (ICP)) low energy deposition process 401 followed by a deposition (Dep) process 402 and then an etching (Etch) process 403. In this process sequence, ICP low energy deposition 401 is used to create a thin deposited layer 512 on the substrate surface to isolate the surface of the substrate and mitigate damage to the substrate during subsequent processing activities. The thin deposited layer 512 is often referred to herein as the "physical buffer layer", or simply the "buffer layer," which in some embodiments can be different from a diffusion barrier layer, liner layer or wetting layer. ICP low energy deposition process 401 is then followed by the deposition process 402 to ensure a desired step coverage and then the etch process 403 to remove any material overhang formed on the features formed on the substrate.

At process 401, as shown in FIG. 5A, one or more of the sources 281, 282 are configured to bias the target 232, while the source magnetron assembly 221 is in motion, and the RF coil 258 is biased to generate a plasma in the chamber that contains both metal ions (e.g., M+ in FIGS. 5A-5B and 5D) and process gas ions, which is also referred to herein as a secondary plasma 211. The pressure in the chamber can be increased over a standard deposition process, which results in a higher number of collisions in the plasma, and thus will reduce the ion energy near the surface of the substrate 205. In one example, the pressure in the processing region 210 during the inductive coupled plasma (ICP) processing mode is between about 1 mTorr and about 100 mTorr, versus a standard deposition process in which the pressure in the processing region 210 is between about 0.05 mTorr and about 50 mTorr. The secondary plasma is formed by collisions between electrons generated in the plasma and the metal and/or gas ions or neutrals in the processing region of the process chamber. The secondary plasma generates a significant number of low-energy ions, which are less damaging to the substrate and deposited layers.

In operation, the processing chamber is loaded with the substrate, and the chamber is pumped down to a predetermined base pressure of about $1\times10^{-6}$ Torr to about $1\times10^{-9}$ Torr. Then, a sputtering gas, such as argon, krypton, helium or xenon, is then introduced into the processing chamber via the gas source 242, and the sputtering gas pressure is controlled within a range of about 0.6 mTorr to about 400 mTorr, preferably between about 20 mTorr to about 100 mTorr. The gas flow rate can be controlled using a mass flow controller (not shown) to achieve the desired pressure range.

During the ICP process 401, the sputtering target 232 is biased with at least one of RF power and DC power by use of the RF source 281 and/or the DC source 282, respectively. The power supplied to the target in one or more of the processing steps is also referred to herein as a first target bias power. To create an efficient sputtering process, the magnetron system 289 positioned in the back of the sputtering target 232 in the upper process assembly 208 utilizes a generated magnetic field (e.g., a first magnetic field) that penetrates the processing region 210 adjacent to the sputtering surface 233 of the sputtering target 232, and allows the formation of the magnetron-controlled plasma 213. The ICP low energy deposition process involves a low power being supplied to the first RF source 281 and/or the DC source 282, to generate the magnetron-controlled plasma 213 that has a low plasma density, resulting in the generation lower energy metal ions and neutrals leaving the target surface 233 during the sputtering process and consequently creating a lower deposition rate deposition process. This creates a sputtering process that is slower, gentler ion bombardment-wise and less damaging to the material disposed on the surface of the substrate. In this process step, RF power is also provided to the RF coil 258, which is configured to form a secondary plasma (e.g., inductively coupled plasma 211) that has a relatively moderate to high plasma density, to improve the amount of ionization of the process gases and sputtered metal atoms, versus the plasma density of the metal ion plasma (e.g., magnetron-controlled plasma 213). The power supplied to the inductive coil 258 in step 401 is also referred to herein as a first RF bias power. In this configuration, the reduced or lower plasma density in the metal ion plasma is created by lowering the applied voltage and/or power provided to the target 232 versus the amount of voltage and/or power provided to the target 232 in a standard deposition process. In one example, the bias power applied to the target 232 is between about 30 kW and about 5 kW of DC power is provided by the DC source 282, and the RF power applied to the RF coil 258 is between about 0.5 and about 3 kW at a frequency of 13.56 MHz. In some embodiments, a collimator 290 is disposed between the target and the inductive coil, and a first voltage bias is applied to the collimator to modulate the ion directionality.

In some embodiments, during the ICP process 401, the substrate is biased with a negative DC voltage or RF power to attract positively charged ions, ionized by the secondary plasma, towards it, which also referred to herein as a first substrate bias. The metal ions in the plasma are attracted towards the substrate and deposit as a thin film. In some embodiments, the resulting thin film buffer layer 512 (e.g., a first deposited layer) deposited during the ICP process 401 has a thickness between about 10 angstroms (Å) and about 100 Å across different portions.

The process conditions used to perform the ICP process 401, such as the amount of bias applied to the coil, the amount of bias applied to the target, the chamber pressure and the substrate bias level, is used to produce a deposited film that is formed at a reduced energy of the sputtered metal ions and neutrals, minimizing damage to the materials disposed at the surface of substrate. As a result, a buffer layer 512 (e.g., first deposited layer) is created on the field, sidewall, and bottom of a dielectric device feature 510 (FIG. 5A). The buffer layer is generally a thin film coating that has a desirable step, sidewall and bottom coverage as shown in FIG. 5A as a deposited film that includes a field portion 514, a sidewall portion 516, and a bottom portion 518. The combined all three portions of the thin film coating act as a protective buffer layer, such that the subsequent deposition step with higher ion energy won't damage the underlying layers, such as a previously deposited diffusion barrier layer, liner layer, wetting layer or dielectric materials within the device features. The low energy deposition results in minimized damage to the substrate and/or prior deposited layers, making the ICP process ideal for delicate materials, such as low-K dielectrics. In some embodiments, the ICP process is designed to be a low-damage process, which forms a thin buffer layer to protect the underlying dielectric material from any damage caused by the application of subsequent high-energy and/or high deposition rate material deposition step performed in the same process chamber. It is a highly beneficial process for applications that demand a gentle approach, especially when working with low K dielectric materials. The ICP process can be used to deposit a variety of materials, including molybdenum, copper, tungsten, titanium, aluminum, tantalum, and nickel, onto a substrate with minimal damage.

Once the ICP process is complete, the deposition process 402 of method 400 can then be performed. In some embodiments, the deposition process 402 is performed in the same process chamber. As shown in FIG. 5B, the sputtering target 232 is biased to deposit a second layer 522 on top of the buffer layer 512. To create an efficient sputtering process, the magnetron system 289 positioned in the back of the sputtering target 232 in the upper process assembly 208 creates a magnetic field (a second magnetic field) in the processing region 210 adjacent to the sputtering surface 233 of the sputtering target 232. To begin the sputtering process, an inert gas such as argon, krypton, helium, or xenon is introduced into the processing chamber 200. The target 232 is then biased by the DC power source 282 and/or RF power source 281, the magnetron-controlled plasma 213 is then formed between the substrate 205 and the sputtering target 232. The power supplied to the target in this processing step is referred as a second target bias power. The second target bias power is greater than the first target bias power in processing step 401. The ions formed within the plasma are accelerated towards the sputtering target 232, dislodging target material that then deposits onto the substrate. The magnetron-controlled plasma 213 increases the density of the plasma near the sputtering target 232, resulting in more efficient sputtering and a higher deposition rate. In some embodiments, a collimator 290 is disposed between the target and the inductive coil, and a second voltage bias is applied to the collimator to modulate the ion directionality. In some embodiments, the second voltage bias applied in step 402 is greater than the first voltage bias applied in step 401.

The second layer 522 created by the deposition process 402 can include a bottleneck structure that is created by the overhang of deposited material, as shown in FIG. 5B. The overhang 524, which is due to the rapid accumulation of deposited metal near the entrance of the device features. The overhang 524 narrows the entrance, blocks metal entering into the feature, and shadows the deposition on the sidewalls, therefore, resulting in a poor sidewall coverage 526 of the device features. The overall thickness of the second layer 522 is between about 100 angstroms (Å) and about 1000 Å.

The process parameters for the deposition process 402 can be controlled to optimize the thickness, uniformity, step-coverage, bottom-coverage, and morphology of the film. For example, the applied DC power and/or RF power, deposition time, and gas pressure can be adjusted to control the ion flux and ion energy, which affect the film's profile, morphology and properties. The substrate temperature can also be controlled to optimize the adhesion and crystallographic orientation of the film. In some embodiments, the chamber pressure is between about 0.05 m Torr to about 50 mTorr, e.g., about 0.5 mTorr, the DC power is between about 1 kW to about 50 kW, e.g., about 35 kW, and the AC bias is between 0 to about 5 kW, e.g., about 600 W. In some embodiments of the deposition process 402, the DC power and/or RF power applied to the target 232 is greater than the DC power and/or RF power applied to the target during the ICP process 401, and the process pressure (e.g., a second process pressure) during the deposition process 402 is less than the process pressure (e.g., a first process pressure) during the ICP process 401. Additionally, in some embodiments, the bias applied to the substrate by the bias source 241 is higher during the deposition process 402 versus the ICP process 401.

Once the deposition process 402 is complete, an etch process 403 is performed using the secondary plasma (e.g., inductively coupled plasma 211). This process removes and/or redistributes the material found in the overhang 524 that may have formed on the substrate during the deposition process 402. It has been found that the etch process 403 also improves sidewall coverage 526 through resputtering. As shown in FIG. 5C, in this processing mode, powers sources the etching process can be performed using the secondary plasma generated by the inductive coil assembly 255. The plasma is formed by energizing the RF coil 258 with the RF power source 256 and the impedance match 257, generating an inductively coupled plasma 211 in the processing region 210. The power supplied to the inductive coil 258 in step 403 is referred as a third RF bias power. The secondary plasma created by the inductive coil assembly 255 allows the ionized gas atoms to bombard the surface of the substrate and alter and/or remove the overhang and increases the opening size.

During the etching process, an inert gas such as argon, krypton, helium, or xenon, is introduced into the processing chamber 200 through the gas source 242 and the conduits 244. The gas then flows into the processing region 210 and interacts with the inductively coupled plasma 211 generated by the inductive coil assembly 255. The plasma then interacts with the process gas, creating etching species such as radicals, and ions that are directed towards the substrate 205 by a bias applied to the substrate by the bias source 241 (referred as a third substrate bias).

The secondary plasma generated by the inductive coil assembly 255 enhances the etching process by increasing the ionization of the gas molecules and the resulting etching species. By altering the radial distribution of the plasma, the electromagnet assemblies can be used to help improve the etching process across the surface of the substrate, and provide more precise control over the etching process.

During the etch process 403, the ionized argon atoms physically bombard the surface and ballistically knock out and/or sculpt the shape of the film. The overhang portion of the deposited film can be etched away faster than other regions in the device features due to the directionality of the ions in the plasma that are controlled by the use of the substrate bias and electromagnets. As shown in FIG. 5C, a resputtering process, which removes and redistributes deposited metals within the device feature, in particular the bottom region, results in a modified metal film layer 532, which has improved sidewall and bottom coverage. As noted above, during the resputtering process, the generated plasma can be used to redistribute metal atoms positioned at the bottom portion of the feature and re-deposit metal atoms on the sidewall portions, resulting in subtraction of materials at the bottom portion and addition of materials at the sidewall portions. This redistribution of material improves the sidewall coverage and film thickness uniformity.

The specific parameters of the etching process, such as gas composition, gas flow rate, pressure, RF power, and bias voltage, can be optimized to achieve the desired etching rate, selectivity, and profile. In some embodiments, the etch rate and selectivity can be controlled by adjusting the plasma chemistry, such as the choice of inert and/or reactive gas, and in some cases the addition of a polymerization gas. The use of a polymerization gas deposits a thin layer of polymer on the sidewalls, which can prevent further etching and improve the device performance. In some embodiments, the etching process can be combined with other processing modes, such as deposition or simultaneous deposition and etching, to create multi-layer structures on the substrate 205 with improved properties and characteristics.

In some embodiments of the etch process 403, no DC power or RF power is applied to the target 232, and the process pressure (third process pressure) during the etch process 403 is less than the process pressure formed during the ICP process 401 and is greater than the process pressure during the deposition process 402. In an alternate embodiment, the process pressure during the etch process 403 is less than the process pressure during the ICP process 401 and is less than the process pressure during the deposition process 402. Additionally, in some embodiments, the bias applied to the substrate by the bias source 241 during the etch process 403 is greater than the bias applied to the substrate during the ICP process 401 and the deposition process 402.

The ICP-Dep-Etch process sequence is a sequential process, making it easier to control than some other process sequences. Each step builds on the previous step, ensuring that the desired outcome is achieved. This process sequence is ideal for applications that require precise control over each process step.

In some embodiments, a two-step ICP-SIM process 410 is used to increase throughput. As shown in FIG. 4B, this process involves two primary processing modes: ICP low energy deposition 411 and Simultaneous Deposition and Etching (SIM) 412.

At step 411, the ICP low energy deposition process is used to create a thin buffer layer on the substrate surface. The purpose of this buffer layer is to protect the underlying dielectric material from damage during the subsequent high-energy deposition step. The ICP process was described in detail above, and thus will not be re-recited here.

At step 412, simultaneous deposition and etching are performed (FIG. 5C). This processing mode combines the deposition process and the etching process within a single step. This is made possible by leveraging both the magneton controlled plasma 213 and inductive coupled plasma 211 in a synchronized process step.

To initiate a SIM process, one or a plurality of processing gases are supplied to the processing region 210 from a gas source 242 via conduits 244. The gas source 242 may comprise a non-reactive gas such as argon, krypton, helium or xenon, which is capable of energetically impinging upon and sputtering material from the sputtering target 232. The gas source 242 may also include a reactive gas, such as one or more of an oxygen-containing gas, fluorine-containing gas or a nitrogen-containing gas.

During a SIM process, both inductively coupled plasma 211 and magneton controlled plasma 213 are activated between the substrate 205 and the sputtering target 232 by turning on at least one of the power sources 281 and 282, and the bias source 241 and power sources 256. In one example, power sources 282 and 256 and bias source 241 are used during processing. The process gas ions are formed and accelerated towards the sputtering target 232, dislodging target material that then deposits onto the substrate. At the same time, the inductive coil assembly 255 forms an inductively coupled plasma 211 during processing that is used to ionize atoms (e.g., M+ in FIGS. 5A and 5C-5D) ejected from the sputtering target 232 and/or ionize process gases (e.g., Ar+ in FIGS. 5B-5C) during processing.

The ions generated in the secondary plasma generated by the RF coil and controlled by the substrate bias are used to redistribute portions of the deposited layer, while the plasma 213 generated by biasing the target 232 deposits material onto the surface of the substrate 205. The first RF assembly (e.g., RF source 281) and/or the DC source assembly (e.g., DC source 282), the second RF assembly (e.g., inductive coil assembly 255) and bias source 241 are each independently adjustable to control the deposition rate and etch rate in simultaneous deposition and etching processes, resulting in improved step coverage. Once the desired thickness and morphology of the metal layers are achieved, the power to the target, the inductive coil assembly and substrate bias source are turned off, and the gas flow is stopped. The chamber is then vented, and the substrate is unloaded from the processing chamber.

The combination of the target-magnetron-controlled plasma and the inductively coupled plasma and applied substrate bias allows for simultaneous deposition and etching of the substrate, increasing the deposition rate and throughput. The SIM process mode offers several advantages over traditional PVD and etching processes. First, The SIM process mode eliminates the need for separate PVD and etching steps, reducing the time and resources required for these processes. This leads to increased process efficiency and throughput. In addition, the simultaneous deposition and etching process ensures that the deposited and redeposited material reaches all desired areas of the features formed in the substrate, resulting in improved step coverage. Moreover, The SIM process mode can reduce the overhang that is typically formed during the PVD process.

Overall, the ICP-SIM process flow provides a low damage deposition process for metal layers with high aspect ratios and good step coverage while minimizing damage to underlying layers and reducing contamination. This process flow is particularly advantageous for applications that require a low-damage process, such as for low K dielectric materials.

In some embodiments, an additional etching step 423 is added at the end of the IMP-SIM sequence (FIG. 4C). This optional etching step 423 is designed to provide further refinement and control over the overhang removal process. The etching step 423 can be performed using the same etchant gas as used in the SIM step, or a different etchant gas can be used for more selective etching.

The etching step 423 can be preferably performed in the same process chamber, or the substrate can be transferred to a different chamber for etching. However, in some embodiments, the etching step is performed in a downstream plasma chamber, which can provide more precise control over the etching process.

During the etching step, the overhangs are selectively removed while leaving the deposited material in the field and bottom regions intact. The etching process is typically performed at a higher source 256 and bias source 241 powers and a higher pressure than the SIM step to provide more aggressive etching. The etching process can be performed for a predetermined time or until the desired level of overhang removal is achieved.

The addition of the etching step in the ICP-SIM sequence provides further refinement and control over the overhang removal process. This embodiment is ideal for applications that require higher throughput while maintaining precise control over overhang removal. The three-step process (ICP-SIM-Etch) 420 allows for the benefits of the higher throughput of the SIM step, while also providing additional control over the etching process.

In some implementations described herein, the biasable flux optimizer 290 is provided to further control ion distribution and directionality during the process. The ability to bias the flux optimizer allows control of the electric field through which the sputter species pass. In one embodiment, the power source 390 coupled to the flux optimizer 290 may supply a voltage power to the flux optimizer 290 in a pulsing, or alternating fashion to assist local deposit onto the substrate 205. The flux optimizer 290 is configured to provide negative and/or positive voltage pulses to the flux optimizer 290 so as to control the flux optimizer 290 in uni-polar or bipolar mode as needed. In one embodiment, the flux optimizer 290 controlled in bipolar mode may control and trap ions, so as to create different ratio of ions and neutrals passing through the flux optimizer 290. It is believed that positive voltage pulses applied to the flux optimizer 290 may draw electrons in the plasma toward the substrate surface while the negative voltage pulses applied to the flux optimizer 290 may repel electrons in the plasma toward the target. Therefore, by pulsing alternating positive and negative voltage to the flux optimizer 290, directionality of the ions and neutrals passing therethrough may be efficiently controlled.

Figure 6:
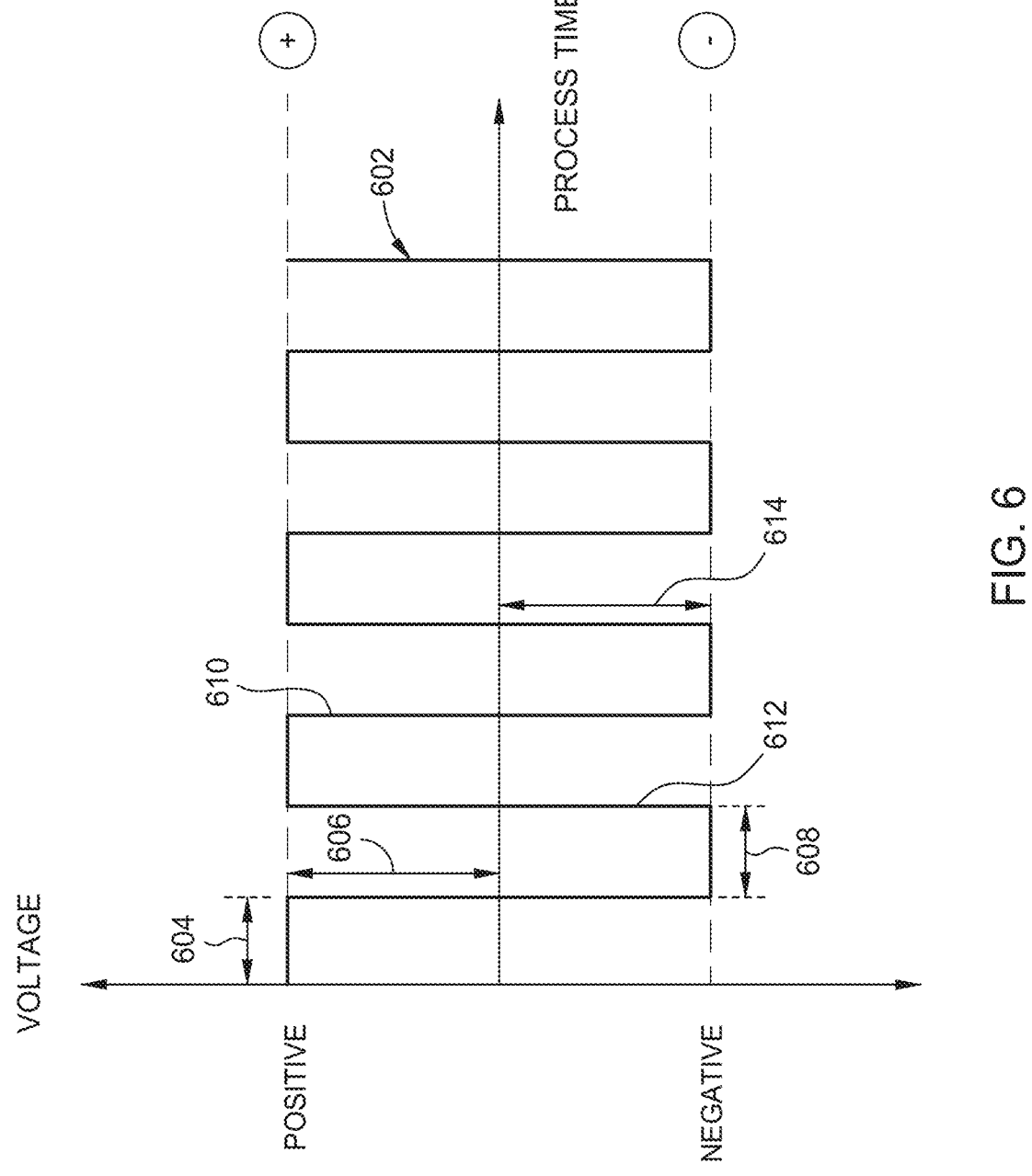
FIG. 6 depicts a voltage applied to the biasable flux optimizer plotted as a function of time in accordance with one embodiment of the present invention.

FIG. 6 depicts a voltage signal 602 detected from the flux optimizer 290 when applying a DC power to the flux optimizer 290. The voltage as supplied from the power source 390 to the flux optimizer 290 may be controlled in a pulsed mode, as depicted in FIG. 6, to pulse alternating positive voltage 610 and negative voltage 612 to the flux optimizer 290. The positive and negative voltage pulses 610, 612 may have a predetermined pulse width 604, 608 (e.g., pulse time) and pulse magnitude 606, 614 (e.g., pulse voltage value) respectively as needed. The pulse modulation (e.g., pulse width and pulse magnitude) is controlled to effectuate a desired deposition profile. For example, in the embodiment wherein more directional ions are desired to be accelerated toward the substrate surface to enhance bottom-up filling capability, a positive voltage may be supplied with a longer pulse width (e.g., longer pulse time) to assist deposition on the bottom of the trench. In contrast, in the embodiment wherein non-directional ions are desired to deposit on sidewalls of the trench, or sputter-etch the deposit at the corner of the trench, a negative voltage may be supplied with a longer pulse width (e.g., longer pulse time) to enhance sidewall deposition management. It is noted that the voltage supplied to the flux optimizer 290 may also be in continuous mode as needed.

In one embodiment, the DC bias power pulse from the power source 390 may have a duty cycle between about 5 percent (e.g., 5 percent on and 95 percent off) to about 70 percent (e.g., 70 percent on and 30 percent off), such as between about 5 percent and about 50 percent, such as between about 15 percent to 45 percent, at a bias frequency between about 400 Hz and about 60 MHz. Alternatively, the cycle of the DC bias power pulsed to the flux optimizer 290 may be controlled by a predetermined number of time periods performed. For example, the DC bias power may be pulsed between about every 1 milliseconds and about every 100 milliseconds. It is noted that the duty cycle of the DC bias power pulsed to the flux optimizer 290 may be repeated as many times as needed. In one embodiment, the DC bias power may be controlled at between about 1 kW and about 10 kW.

In some implementations of the present disclosure, a biasable flux optimizer that has a high effective aspect ratio while maintaining a low aspect ratio along the periphery of the flux optimizer of the hexagonal array of the flux optimizer is provided. In some implementations, a biasable flux optimizer with a tapered entrance portion in the hexagonal array is provided. It has been found that use of a tapered entrance portion in the flux optimizer substantially reduces deposition overhang and clogging of the cells of the hexagonal array in comparison with prior art flux optimizer designs. Compared to prior art flux optimizer designs, these various features substantially increase film uniformity and extend the life of the flux optimizer and process kit while reducing periods between cleaning.

Substrate Processing Examples

The following tables illustrate processing examples that may be used to process a substrate by use of one or more of the methods provided herein. The example provided herein are not intended to be limiting but are meant to illustrate one or more of the process sequences described herein.

As described above, some of the process variables and their associated values used during processing are illustrated in Table 1. The process values provide in Table 1 are not intended to be limiting as to the scope of the disclosure provided herein. Moreover, it should be understood that one or more of the process variables listed in Table 1 may not be applied or used during the performance of a process performed on a substrate in a processing chamber.

TABLE 1

| Process Variable Examples | Ref. | Range | Units |
|---|---|---|---|
| Target DC Power | TDC | 0-20 | kW |
| Target RF Power (13.56 MHz or 40 MHz) | TRF | 0-5 | kW |
| ICP Coil Power (13.56 MHz) | CP | 0-5 | kW |
| Substrate Bias (13.56 MHz) | SB | 0-5 | kW |
| Chamber Pressure | P | 1-1,000 | mTorr |
| Flux Optimizer Bias | FOB | 0-200 | Volts |
| First Electromagnet Bias | FEB | 0-50 | Gauss (G) |
| Second Electromagnet Bias | SEB | 0-50 | Gauss (G) |
| Third Electromagnet Bias | TEB | 0-50 | Gauss (G) |
| Substrate Temperature | T | 0-500 | Celsius |

In an effort to illustrate processing examples and provide comparisons between different portions of the processes described herein the following tables are provided below. In one comparative example, as illustrated in the first table below, during the process 401 a target DC Power (TDC) may be provided in a range between 2 and 6 kW DC and an ICP Coil Power (CP) in a range between 2.5 and 3.5 kW is applied to the coil 258 by the power source 256, while during the process 402 a target DC Power (TDC) may be provided in a range between 10 and 20 kW DC and an ICP Coil Power (CP) applied to the coil 258 during the deposition process 402 is zero. A process variable value of zero in one or more of the examples provided below signifies that a process variable and its support structure are not used and/or not required during the provided process example, while a range of values that includes zero in the tables below can be considered to be the operating limits of a device within the range specified in table.

Example 1—Method 400

| Process | TDC (kW) | TRF (kW) | CP (kW) | SB (kW) | P (mTorr) | FOB ($V_{DC}$) | FEB (G) | SEB (G) | TEB (G) | T (° C.) |
|---|---|---|---|---|---|---|---|---|---|---|
| 401 | 2-6 | 0 | 2.5-3.5 | 1-2 | 10-20 | 0 | 0 | 0 | 0 | 200-400 |
| 402 | 10-20 | 0 | 0 | 1-2 | 1-5 | 0 | 0 | 0 | 0 | 200-400 |
| 403 | 0 | 0 | 2.5-3.5 | 1-2 | 1-5 | 0 | 0 | 0 | 0 | 200-400 |

Example 2—Method 410

| Process | TDC (kW) | TRF (kW) | CP (kW) | SB (kW) | P (mTorr) | FOB ($V_{DC}$) | FEB (G) | SEB (G) | TEB (G) | T (° C.) |
|---|---|---|---|---|---|---|---|---|---|---|
| 411 | 2-6 | 0 | 2.5-3.5 | 1-2 | 10-20 | 0 | 0 | 0 | 0 | 200-400 |
| 412 | 10-15 | 0 | 1.5-3.0 | 1-2 | 1-5 | 0 | 0 | 0 | 0 | 200-400 |

Example 3—Method 420

| Process | TDC (kW) | TRF (kW) | CP (kW) | SB (kW) | P (mTorr) | FOB ($V_{DC}$) | FEB (G) | SEB (G) | TEB (G) | T (° C.) |
|---|---|---|---|---|---|---|---|---|---|---|
| 421 | 2-6 | 0 | 2.5-3.5 | 1-2 | 10-20 | 0 | 0 | 0 | 0 | 200-400 |
| 422 | 10-15 | 0 | 1.5-3.0 | 1-2 | 1-5 | 0 | 0 | 0 | 0 | 200-400 |
| 423 | 0 | 0 | 1.5-3.0 | 1-2 | 1-5 | 0 | 0 | 0 | 0 | 200-400 |

While the foregoing is directed to embodiments of the present disclosure, other and further embodiments of the disclosure may be devised without departing from the basic scope thereof, and the scope thereof is determined by the claims that follow.

What is claimed is:

1. A method for fabricating a semiconductor device, comprising:

forming, within a process chamber, a first layer on a surface of a substrate that comprises a plurality of features formed therein, wherein forming the first layer comprises:

biasing a target at a first target bias power;

biasing an inductive coil at a first RF bias power while the target is biased to the first target bias power, wherein the inductive coil is disposed between the target and a substrate support that is configured to support the substrate;

applying a first voltage bias to a collimator disposed between the target and the inductive coil; and adjusting a pressure within a processing region of the process chamber to a first process pressure;

forming, within the process chamber, a second layer on the surface of the substrate, wherein forming the second layer comprises:

biasing the target at a second target bias power, wherein the second target bias power is greater than the first target bias power;

biasing the inductive coil at a second RF bias power, wherein the second RF bias power is less than the first RF bias power;

applying a second voltage bias to the collimator, wherein the first voltage bias is less than the second voltage bias; and adjusting the pressure within the processing region of the process chamber to a second process pressure, wherein the second process pressure is less than the first process pressure; and exposing, within the process chamber, at least a portion of the second layer to a plasma containing an inert gas, wherein exposing the at least a portion of the second layer comprises:

biasing the inductive coil at a third RF bias power, wherein the third RF bias power is greater than the second RF bias power; and adjusting the pressure within the processing region of the process chamber to a third process pressure, wherein the third process pressure is less than the first process pressure.

2. The method of claim 1, wherein the second RF bias power is equal to zero.

3. The method of claim 1, wherein the first layer has a thickness that is between 10 angstroms (Å) and 100 Å.

4. The method of claim 1, wherein the second layer has a thickness that is between 100 angstroms (Å) and 1000 Å.

5. The method of claim 1, wherein the forming the first layer on the surface of the substrate further comprises:

applying a first substrate bias to an electrode disposed within the substrate support;

the forming the second layer on the surface of the substrate further comprises:

applying a second substrate bias to the electrode disposed within the substrate support, wherein the second substrate bias is greater than the first substrate bias; and the exposing the at least a portion of the second layer to the plasma further comprises:

applying a third substrate bias to the electrode disposed within the substrate support, wherein the third substrate bias is greater than the second substrate bias.

6. The method of claim 1, wherein the inductive coil and the target comprise the same material.

7. The method of claim 6, wherein the inductive coil is disposed within the process region.

8. A method for fabricating a semiconductor device, comprising:

forming, within a process chamber, a first layer on a surface of a substrate that comprises a plurality of features formed therein, wherein forming the first layer comprises:

biasing a target at a first target bias power;

biasing an inductive coil at a first RF bias power while the target is biased to the first target bias power, wherein the inductive coil is disposed between the target and a substrate support that is configured to support the substrate;

applying a first voltage bias to a collimator disposed between the target and the inductive coil;

adjusting a pressure within a processing region of the process chamber to a first process pressure; and generating a first magnetic field within the process region by biasing a first external coil; and forming, within the process chamber, a second layer on the surface of the substrate, wherein forming the second layer comprises:

biasing the target at a second target bias power, wherein the second target bias power is greater than the first target bias power;

biasing the inductive coil at a second RF bias power, wherein the second RF bias power is less than the first RF bias power;

applying a second voltage bias to the collimator, wherein the first voltage bias is less than the second voltage bias;

adjusting the pressure within the processing region of the process chamber to a second process pressure, wherein the second process pressure is less than the first process pressure;

generating a second magnetic field within the process region by biasing the first external coil; and applying a first substrate bias to an electrode disposed within the substrate support.

9. The method of claim 8, wherein the second RF bias power is equal to zero.

10. The method of claim 8, wherein the first layer has a thickness that is between 10 angstroms (Å) and 100 Å.

11. The method of claim 8, wherein the second layer has a thickness that is between 100 angstroms (Å) and 1000 Å.

12. The method of claim 8, wherein the forming the first layer on the surface of substrate further comprises:

applying a substrate bias to the electrode disposed within the substrate support.

13. The method of claim 8, wherein the inductive coil and the target comprise a same material.

14. The method of claim 13, wherein the inductive coil is disposed within the process region.

* * * * *